(12) United States Patent
Nguyen et al.

(10) Patent No.: US 8,169,831 B2
(45) Date of Patent: May 1, 2012

(54) HIGH SPEED SENSE AMPLIFIER ARRAY AND METHOD FOR NON-VOLATILE MEMORY

(75) Inventors: Hao Thai Nguyen, San Jose, CA (US);
Man Lung Mui, Santa Clara, CA (US);
Seungpil Lee, San Ramon, CA (US);
Fanglin Zhang, Fremont, CA (US);
Chi-Ming Wang, Fremont, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 13/100,164

(22) Filed: May 3, 2011

(65) Prior Publication Data

US 2011/0205804 A1   Aug. 25, 2011

Related U.S. Application Data

(62) Division of application No. 12/128,535, filed on May 28, 2008, now Pat. No. 7,957,197.

(51) Int. Cl.
*G11C 16/26* (2006.01)

(52) U.S. Cl. ......... 365/185.21; 365/185.25; 365/185.17; 365/185.33

(58) Field of Classification Search ............. 365/185.33, 365/185.21, 185.22, 185.17, 185.25
See application file for complete search history.

(56) References Cited

U.S. PATENT DOCUMENTS

| 4,785,427 | A | 11/1988 | Young |
| 5,070,032 | A | 12/1991 | Yuan et al. |
| 5,095,344 | A | 3/1992 | Harari |
| 5,172,338 | A | 12/1992 | Mehrotra et al. |
| 5,313,421 | A | 5/1994 | Guterman et al. |
| 5,315,541 | A | 5/1994 | Harari et al. |
| 5,343,063 | A | 8/1994 | Yuan et al. |

(Continued)

FOREIGN PATENT DOCUMENTS

EP    0 974 076 A1    7/2000

(Continued)

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

(Continued)

*Primary Examiner* — Andrew Q Tran
(74) *Attorney, Agent, or Firm* — Davis Wright Tremaine LLP

(57) ABSTRACT

Sensing circuits for sensing a conduction current of a memory cell among a group of non-volatile memory cells being sensed in parallel and providing the result thereof to a data bus are presented. A precharge circuit is coupled to a node for charging the node to an initial voltage. An intermediate circuit is also coupled to the node and connectable to the memory cell, whereby current from the precharge circuit can be supplied to the memory cell. The circuit also includes a comparator circuit to perform a determination the conduction current by a rate of discharge at the node; a data latch coupled to the comparator circuit to hold the result of said determination; and a transfer gate coupled to the data latch to supply a result latched therein to the data bus independently of the node. This arrangement improves sensing performance and can help to eliminate noise on the analog sensing path during sensing and reduce switching current.

17 Claims, 23 Drawing Sheets

U.S. PATENT DOCUMENTS

| | | | |
|---|---|---|---|
| 5,570,315 A | 10/1996 | Tanaka et al. |
| 5,595,924 A | 1/1997 | Yuan et al. |
| 5,661,053 A | 8/1997 | Yuan |
| 5,768,192 A | 6/1998 | Eitan |
| 5,903,495 A | 5/1999 | Takeuchi et al. |
| 6,011,725 A | 1/2000 | Eitan |
| 6,046,935 A | 4/2000 | Takeuchi et al. |
| 6,222,762 B1 | 4/2001 | Guterman et al. |
| 6,490,199 B2 | 12/2002 | Lee et al. |
| 6,657,891 B1 | 12/2003 | Shibata et al. |
| 7,046,568 B2 | 5/2006 | Cernea |
| 7,173,854 B2 | 2/2007 | Cernea et al. |
| 7,345,928 B2 | 3/2008 | Li |
| 7,376,030 B2 | 5/2008 | Cernea |
| 7,447,079 B2 | 11/2008 | Nguyen et al. |
| 7,518,945 B2 * | 4/2009 | Kim ........................ 365/230.08 |
| 7,593,265 B2 | 9/2009 | Nguyen et al. |
| 7,957,197 B2 | 6/2011 | Nguyen et al. |
| 7,978,526 B2 | 7/2011 | Nguyen et al. |
| 2001/0014035 A1 | 8/2001 | Briner |
| 2002/0172076 A1 | 11/2002 | Marotta et al. |
| 2004/0125651 A1 | 7/2004 | Toda |
| 2005/0169082 A1 | 8/2005 | Cernea |
| 2005/0219905 A1 | 10/2005 | Watanabe |
| 2006/0034122 A1 | 2/2006 | Betser et al. |
| 2006/0140007 A1 | 6/2006 | Cernea et al. |
| 2007/0153604 A1 | 7/2007 | Tsao et al. |
| 2009/0168540 A1 | 7/2009 | Nguyen et al. |
| 2010/0008148 A1 | 1/2010 | Nguyen et al. |

FOREIGN PATENT DOCUMENTS

| | | |
|---|---|---|
| EP | 1 288 964 | 3/2003 |

OTHER PUBLICATIONS

Notification of Transmittal of the International Search Report and the Written Opinion of the International Searching Authority, or the Declaration, International Application No. PCT/US2009/039082 dated Jun. 19, 2009, 12 pages.

* cited by examiner

Convention Programming with alternate Progam/Verify sequence

HIGH SPEED SENSE AMPLIFIER ARRAY AND METHOD FOR NON-VOLATILE MEMORY

CROSS-REFERENCE TO RELATED APPLICATION

This application is a divisional of U.S. patent application Ser. No. 12/128,535, filed May 28, 2008, which application is incorporated it its entirety by this reference.

FIELD OF THE INVENTION

This invention relates generally to non-volatile semiconductor memory such as electrically erasable programmable read-only memory (EEPROM) and flash EEPROM, and specifically to sensing circuits and memory operations in speed is increased for the operation of sensing circuits.

BACKGROUND OF THE INVENTION

Solid-state memory capable of nonvolatile storage of charge, particularly in the form of EEPROM and flash EEPROM packaged as a small form factor card, has become the storage of choice in a variety of mobile and handheld devices, notably information appliances and consumer electronics products. Unlike RAM (random access memory) that is also solid-state memory, flash memory is non-volatile and retains its stored data even after power is turned off. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card, are ideally suited in the mobile and handheld environment because of its small size, low power consumption, high speed and high reliability features.

EEPROM and electrically programmable read-only memory (EPROM) are non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions.

The floating gate can hold a range of charges and therefore can be programmed to any threshold voltage level within a threshold voltage window (also referred to as a "conduction window"). The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell. When the threshold voltage is partitioned into two distinct regions, each memory cell will be able to store one bit of data. Similarly, when the threshold voltage window is partitioned into more than two distinct regions, each memory cell will be able to store more than one bit of data.

In a two-state EEPROM cell, at least one current breakpoint level is established so as to partition the conduction window into two regions. When a cell is read by applying predetermined, fixed voltages, its source/drain current is resolved into a memory state by comparing with the breakpoint level (or reference current IREF). If the current read is higher than that of the breakpoint level, the cell is determined to be in one logical state (e.g., a "zero" state). On the other hand, if the current is less than that of the breakpoint level, the cell is determined to be in the other logical state (e.g., a "one" state). Thus, such a two-state cell stores one bit of digital information. A reference current source, which may be externally programmable, is often provided as part of a memory system to generate the breakpoint level current.

In order to increase memory capacity, flash EEPROM devices are being fabricated with higher and higher density as the state of the semiconductor technology advances. Another method for increasing storage capacity is to have each memory cell store more than two states.

For a multi-state or multi-level EEPROM memory cell, the conduction window is partitioned into more than two regions by more than one breakpoint such that each cell is capable of storing more than one bit of data. The information that a given EEPROM array can store is thus increased with the number of states that each cell can store. EEPROM or flash EEPROM with multi-state or multi-level memory cells have been described in U.S. Pat. No. 5,172,338.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate.

The memory device may be erased by a number of mechanisms. For EPROM, the memory is bulk erasable by removing the charge from the floating gate by ultraviolet radiation. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more blocks at a time, where a block may consist of 512 bytes or more of memory.

The memory devices typically comprise one or more memory chips that may be mounted on a card. Each memory chip comprises an array of memory cells supported by peripheral circuits such as decoders and erase, write and read circuits. The more sophisticated memory devices operate with an external memory controller that performs intelligent and higher level memory operations and interfacing.

There are many commercially successful non-volatile solid-state memory devices being used today. These memory devices may be flash EEPROM or may employ other types of nonvolatile memory cells. Examples of flash memory and systems and methods of manufacturing them are given in U.S. Pat. Nos. 5,070,032, 5,095,344, 5,315,541, 5,343,063, and 5,661,053, 5,313,421 and 6,222,762. In particular, flash memory devices with NAND string structures are described in U.S. Pat. Nos. 5,570,315, 5,903,495, 6,046,935.

Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

Programming a page of memory cells typically involves a series of alternating program/verify cycles. Each program cycle has the page of memory cells subject to one or more programming voltage pulses. The program cycle is followed by a verify cycle in which each cell is read back to determine if it has been programmed correctly. Those cells that have been verified will be program-inhibited from subsequent programming pulses. The program/verify cycles continue with increasing programming voltage level until all cells in the page have been program-verified.

Both reading and verifying operations are performed by executing one or more sensing cycle in which the conduction current or threshold voltage of each memory cell of the page is determined relative to a demarcation value. In general, if the memory is partitioned into n states, there will be at least n−1 sensing cycles to resolve all possible memory states. In many implementations each sensing cycle may also involve two or more passes. For example, when the memory cells are closely packed, interactions between neighboring charge storage elements become significant and some sensing techniques involve sensing memory cells on neighboring word lines in order to compensate for errors caused by these interactions.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page of contiguous memory cells. All memory elements of a page will be read or programmed together. In currently produced semiconducting integrated circuit memory chips, a memory page may have as many as 64,000 memory cells or memory elements being read or sensed in parallel.

There is an ongoing need for increased performance. Additionally, the massively parallel memory page presents significant issues of noise and interference among the closely packed memory cells and structures that limit sensing accuracy and ultimately performance and storage capacity.

Therefore there is a general need for high capacity and high performance non-volatile memory. In particular, there is a need for sensing circuits of increased speed and less noise.

SUMMARY OF INVENTION

Sensing circuits, for sensing a conduction current of a memory cell among a group of non-volatile memory cells being sensed in parallel and providing the result thereof to a data bus, are presented. In an exemplary embodiment, a precharge circuit is coupled to a node for charging the node to an initial voltage. An intermediate circuit is also coupled to the node and connectable to the memory cell, whereby current from the precharge circuit can be supplied to the memory cell. The circuit also includes a comparator circuit to perform a determination the conduction current by a rate of discharge at the node; a data latch coupled to the comparator circuit to hold the result of said determination; and a transfer gate coupled to the data latch to supply a result latched therein to the data bus independently of the node.

According to one set of aspects, this allows a method of sensing conduction current of non-volatile memory cells, where the method includes providing a node accessible by one or more memory cells via an intermediate circuit; precharging the node to an initial voltage for a first sensing operation; discharging the node through a first of the memory cells via the intermediate circuit; measuring the conduction current though the first memory cell by the rate of said discharging of the node; latching the result of said measuring; and outputting the latched result to a data bus. In one set of aspects, subsequent to said latching but prior to completing said outputting, precharging the node for a second sensing operation. In another set of aspects, the latched result is output to a data bus by a path independent of the node and the intermediate circuit. In a further aspect, outputting the latched result to a data bus independently of intermediate circuit reduces noise in the intermediate circuit.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIG. 7(2) illustrates a preferred, 2-bit LM coding to represent the four possible memory states shown in FIG. 7(1).

FIG. 8(2) illustrates a preferred, 3-bit LM coding to represent the eight possible memory states shown in FIG. 8(1).

DETAILED DESCRIPTION OF THE PREFERRED EMBODIMENTS

Memory System

FIG. 1 to FIG. 11 illustrate example memory systems in which the various aspects of the present invention may be implemented.

Figure 12A:
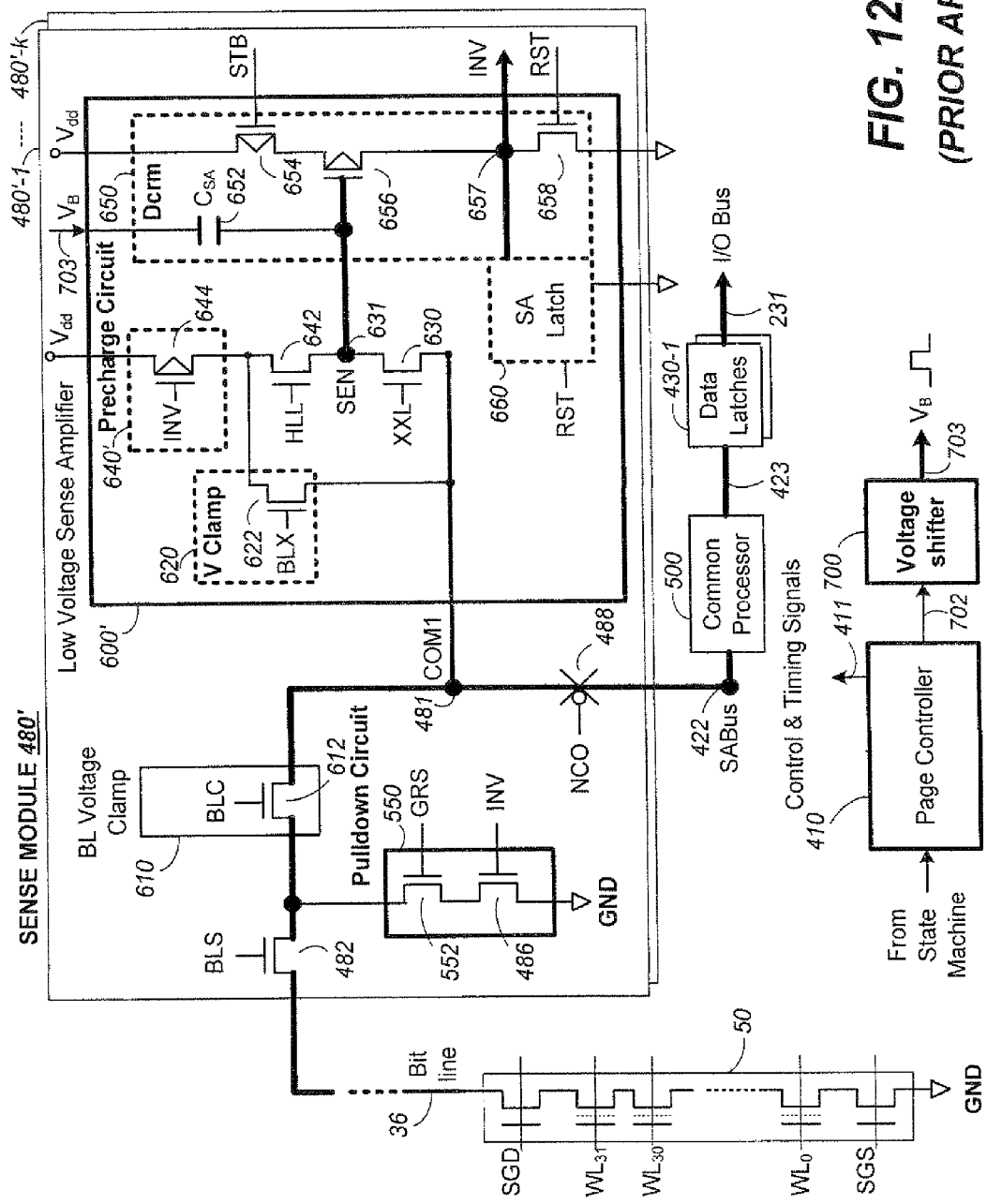
FIG. 12A illustrates schematically an existing implementation of the sense modules shown in FIGS. 9 and 11.
Figure 12B:
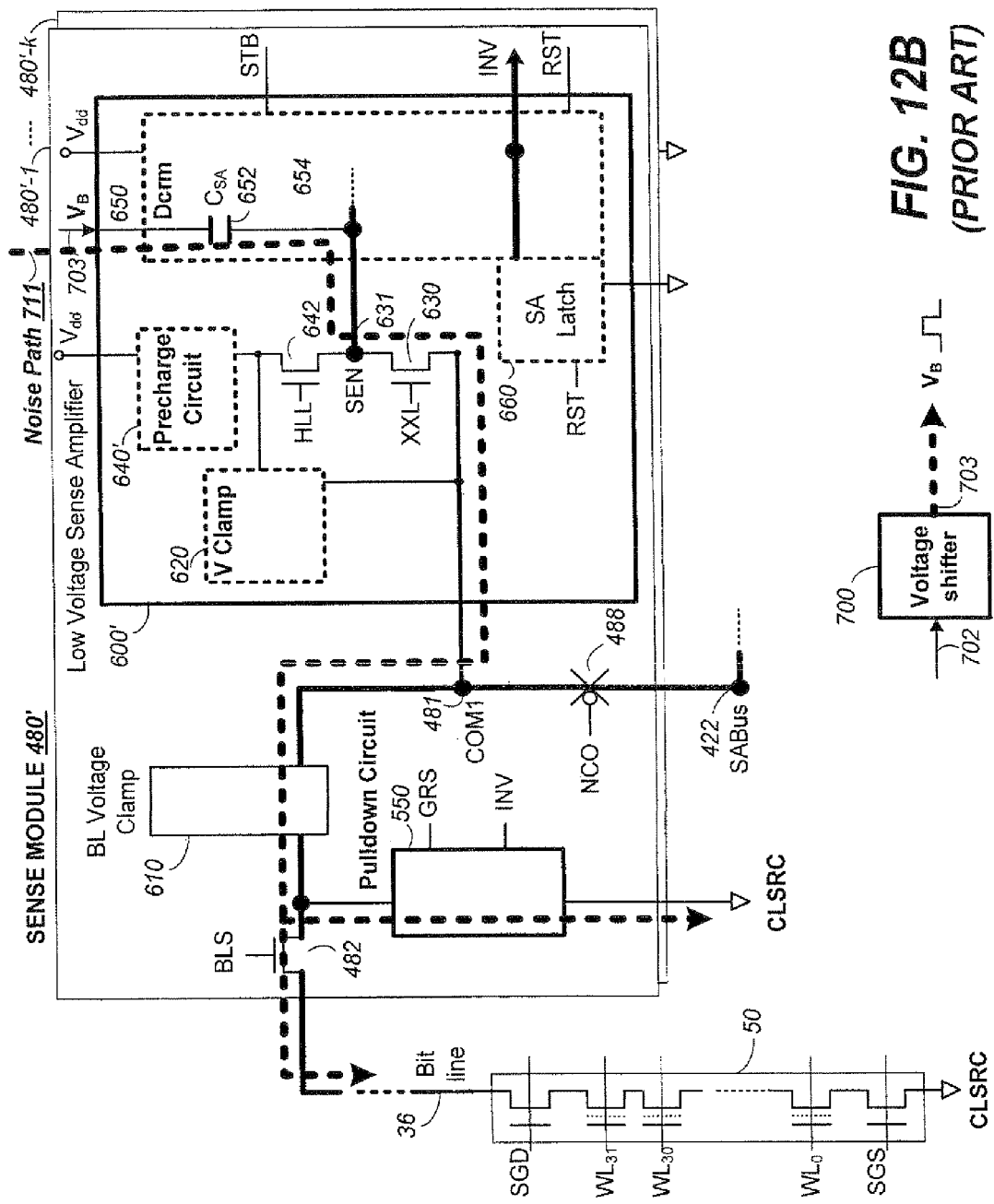
FIG. 12B illustrates the noise path of the sense module shown in FIG. 12A that has entered into a lockout mode.
Figure 13:
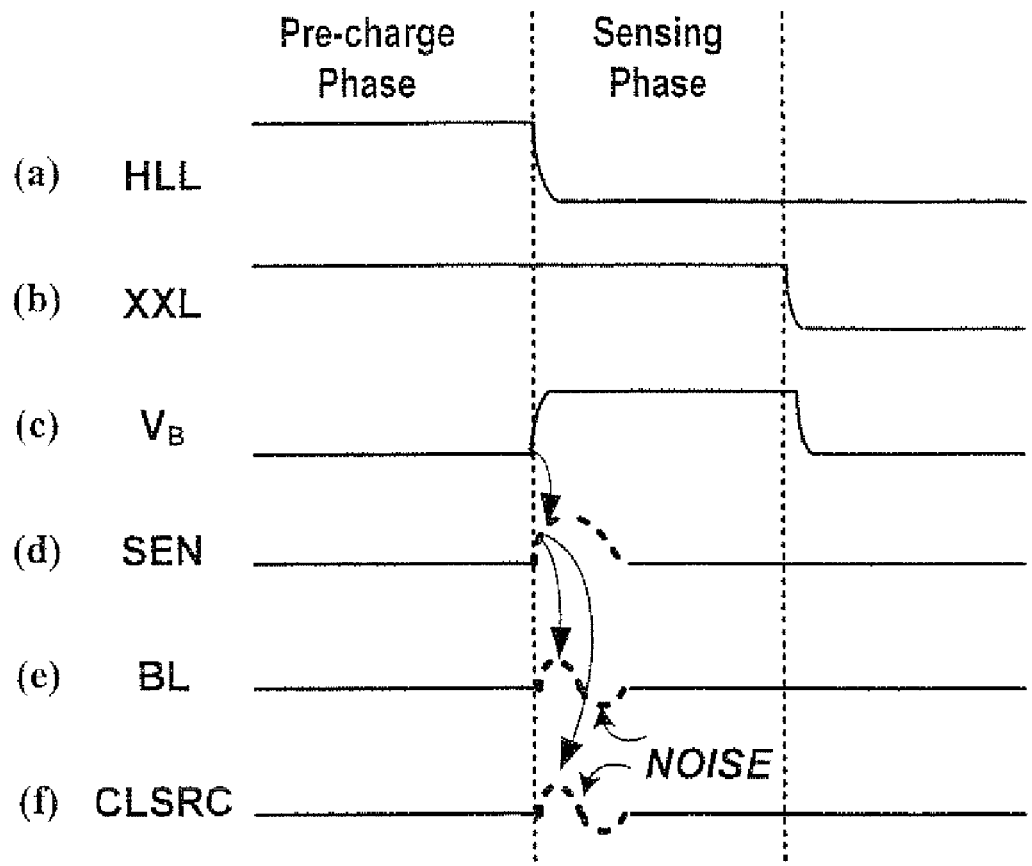
FIG. 13 illustrates the timing of the control signals for the existing sense module shown in FIG. 12B that has entered the lockout mode.

FIG. 12 to FIG. 13 illustrate noise problems in existing sensing circuits.

FIG. 16 to FIG. 19 illustrate the various aspects and embodiments in which noise problems are addressed.

Figure 20A:
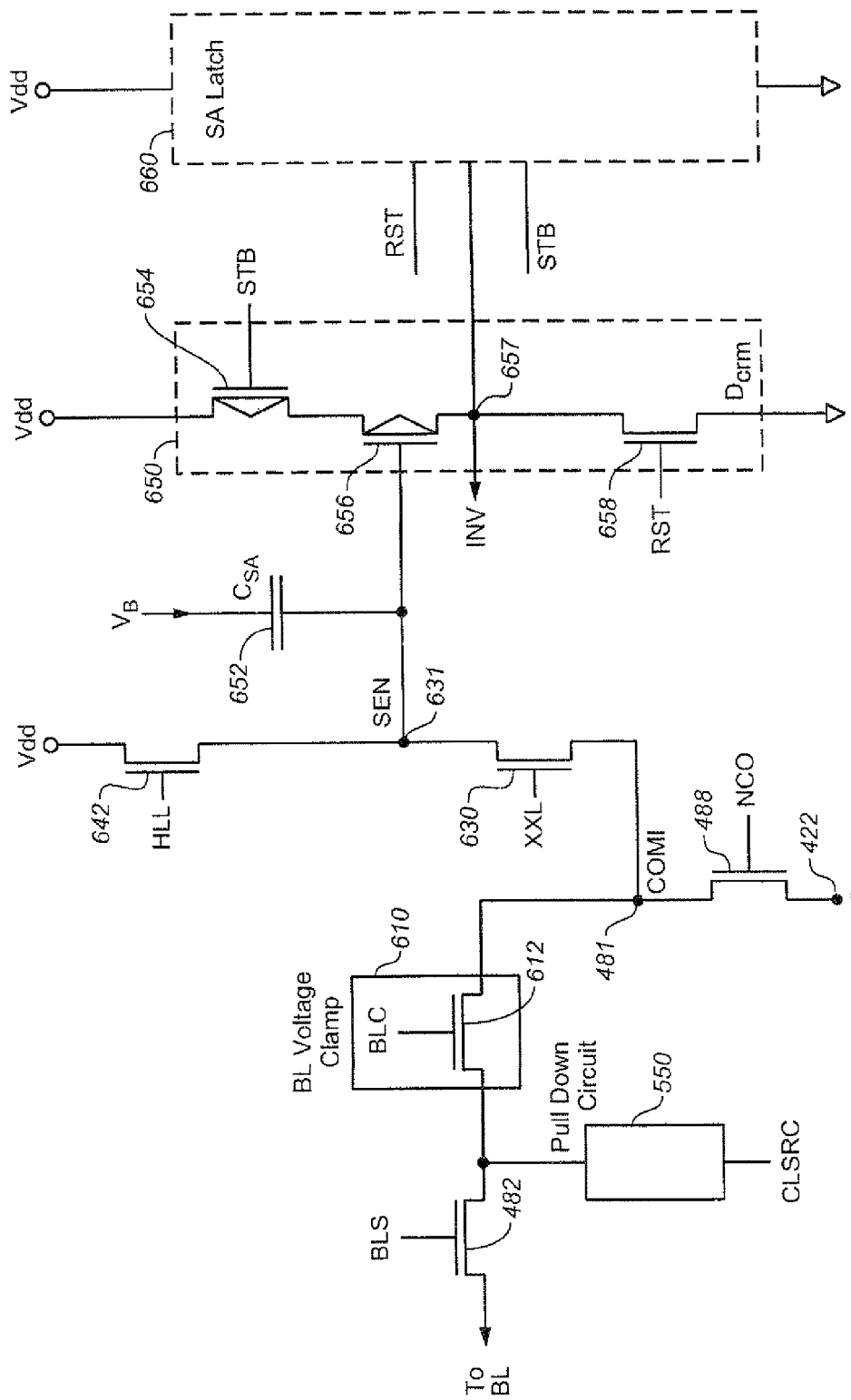
FIGS. 20A-C illustrate a sense module having a path for data transferral that overlaps the analog path for sensing.
Figure 20B:
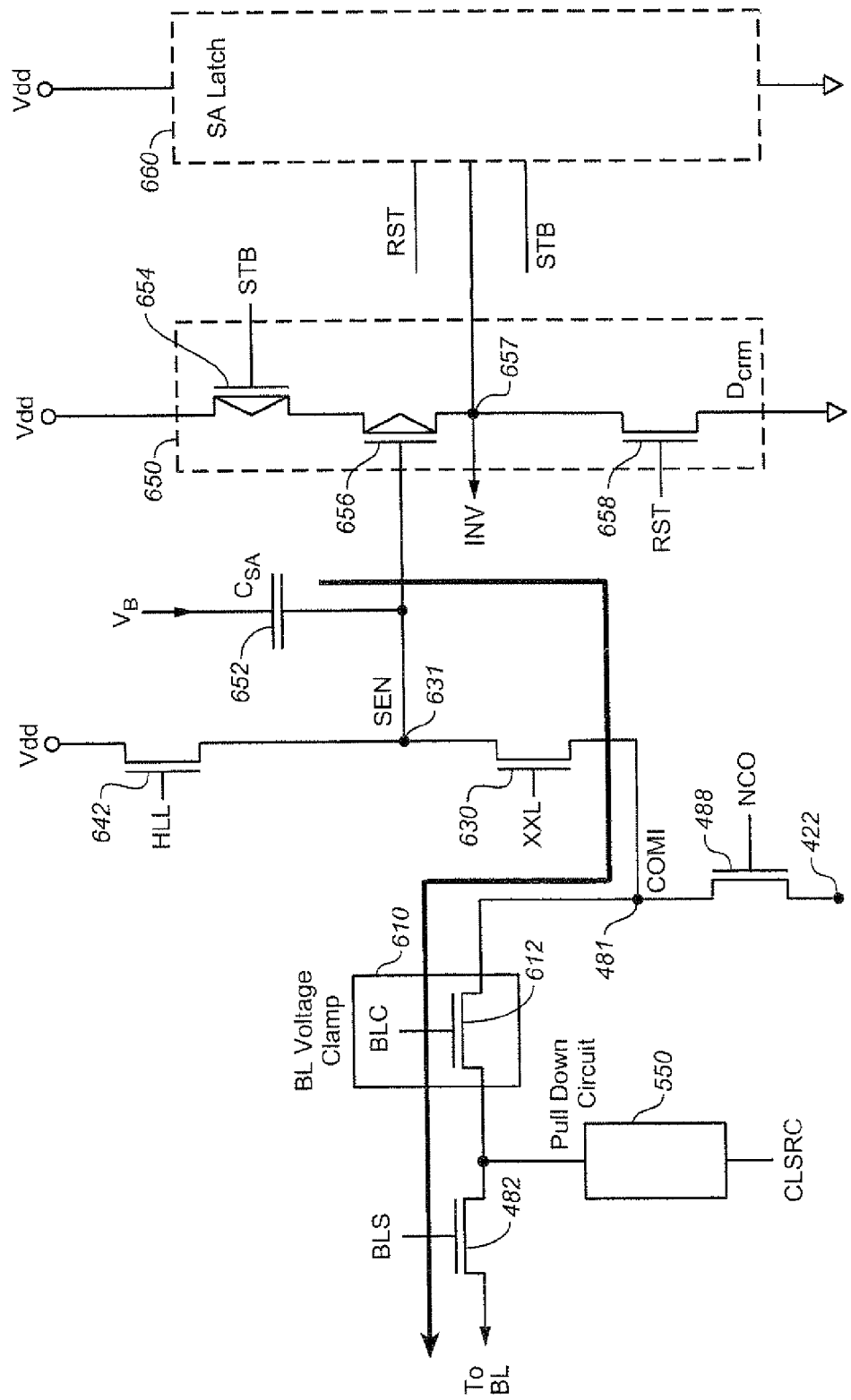
Figure 20C:
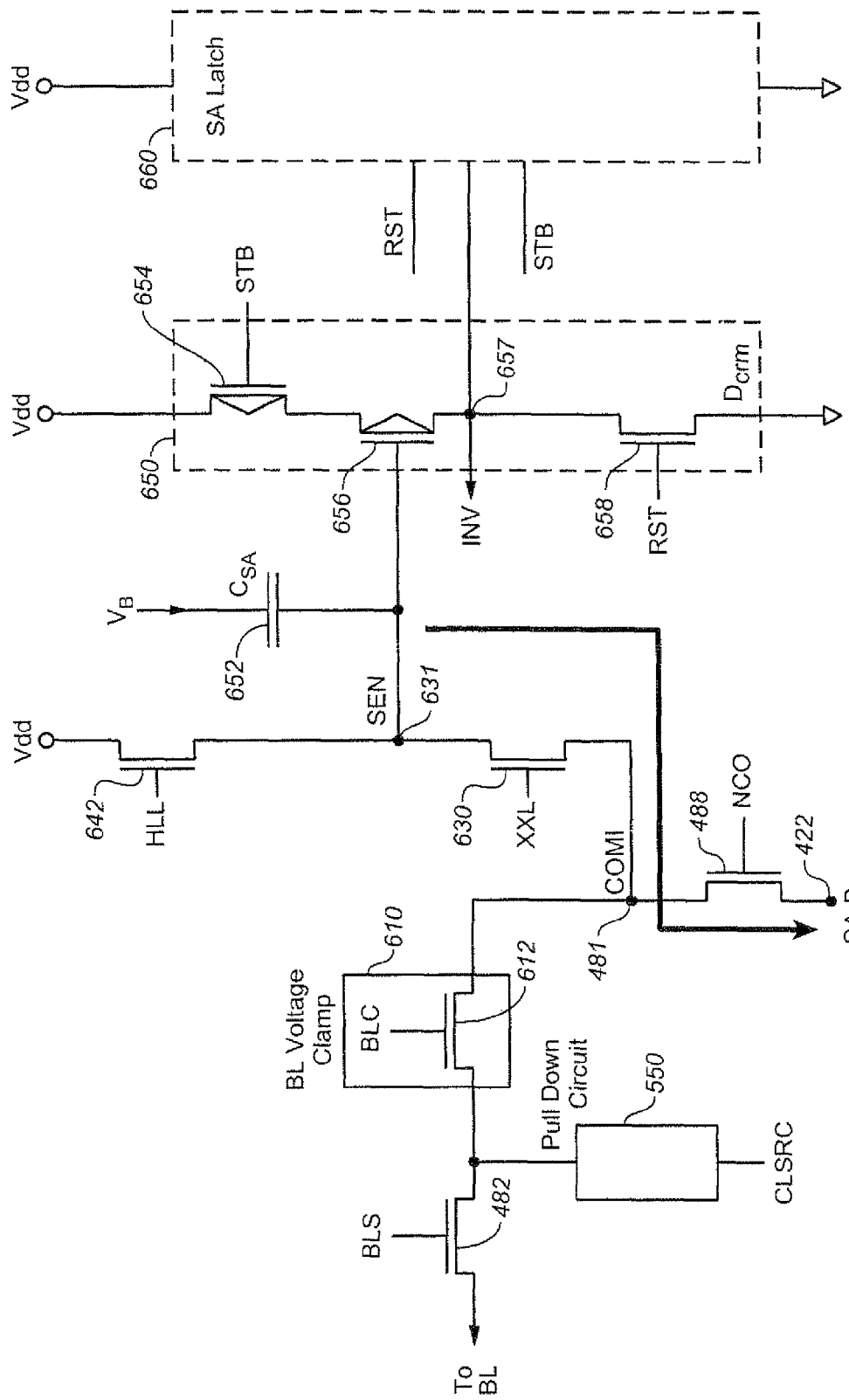

FIGS. 20A-C illustrate a sense module having a path for data transferral that overlaps the analog path for sensing.

Figure 21A:
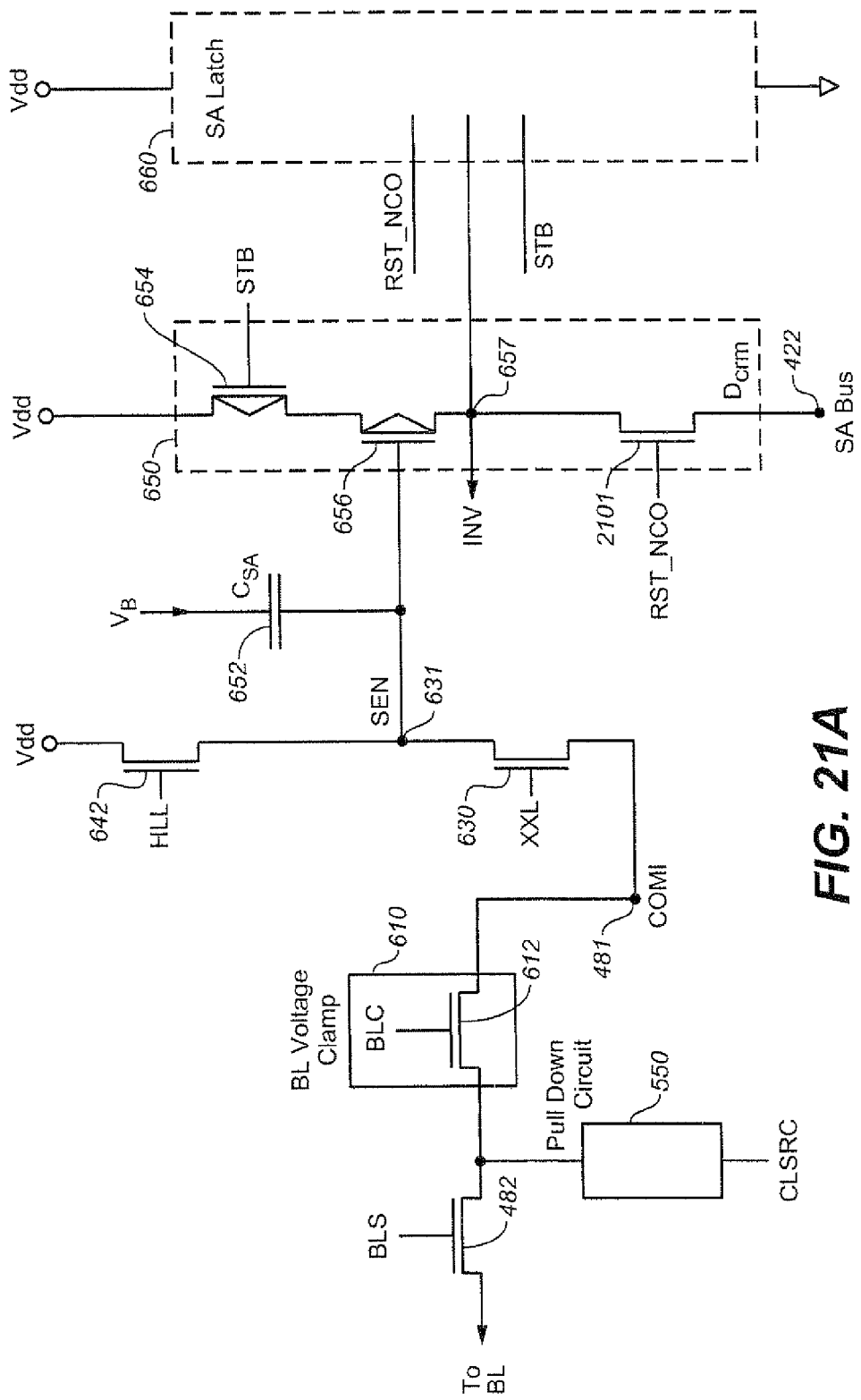
FIGS. 21A-C illustrate a sense module having a path for data transferral that is distinct from the analog path for sensing.
Figure 21B:
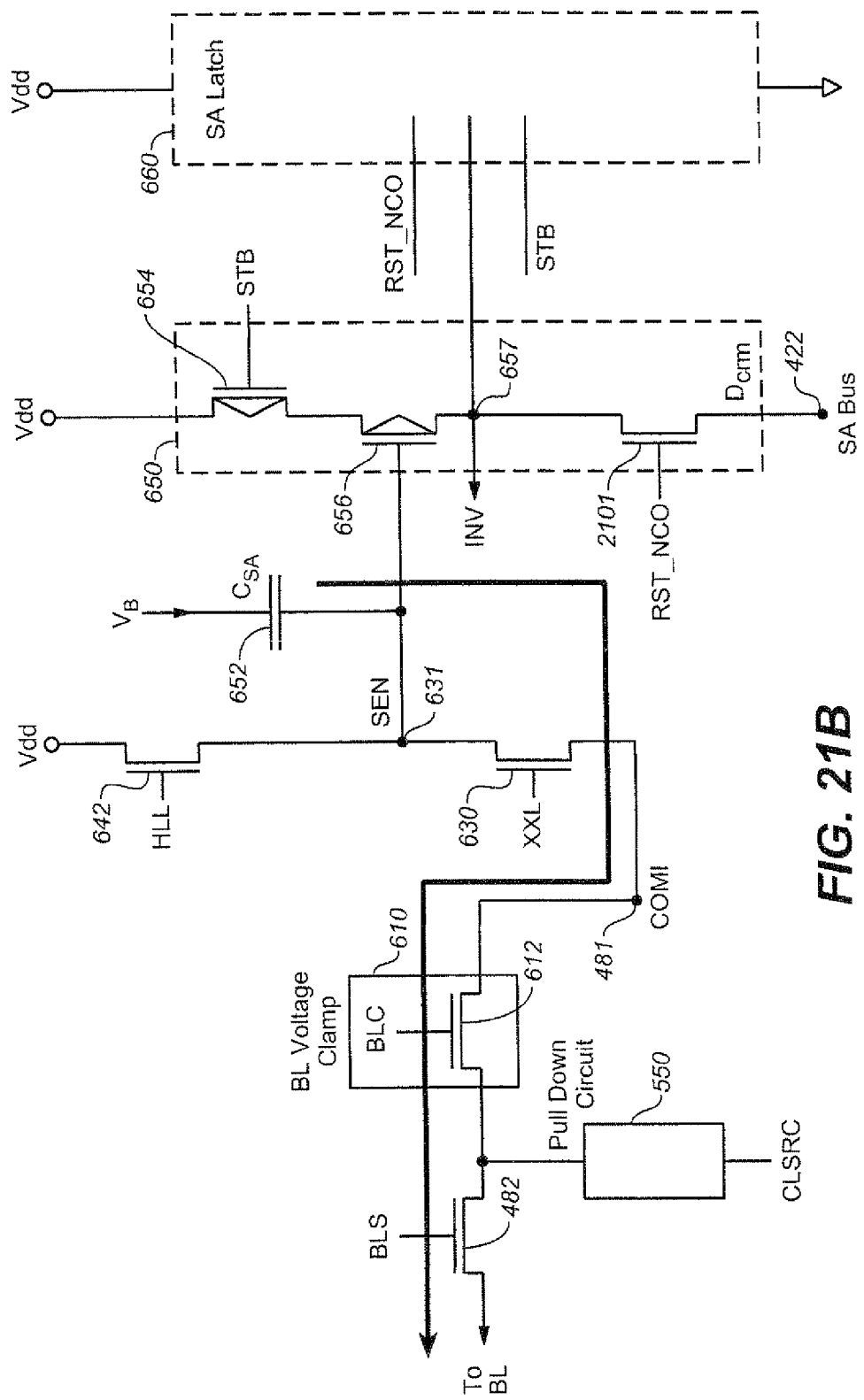
Figure 21C:
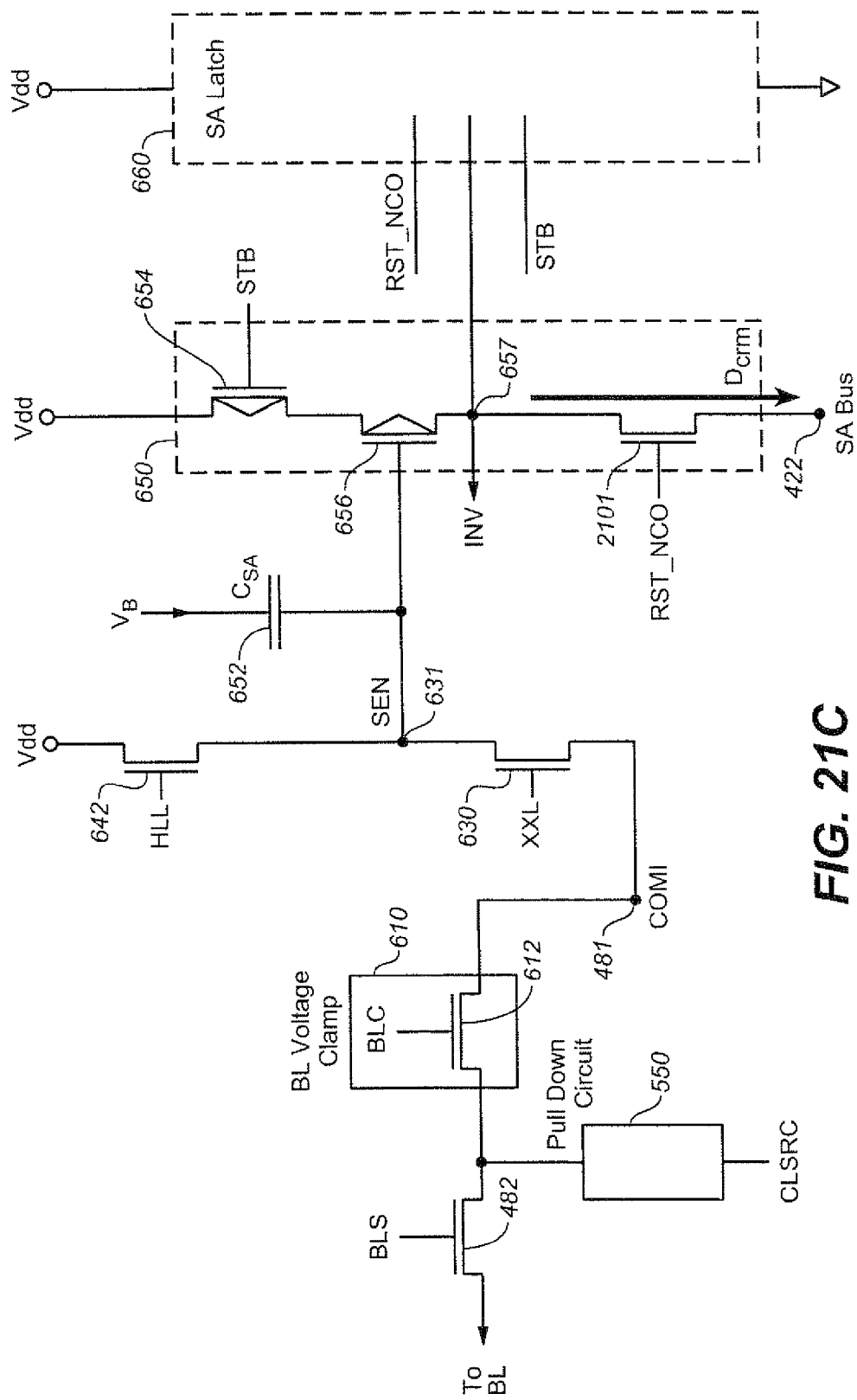

FIGS. 21A-C illustrate a sense module having a path for data transferral that is distinct from the analog path for sensing.

Figure 1:
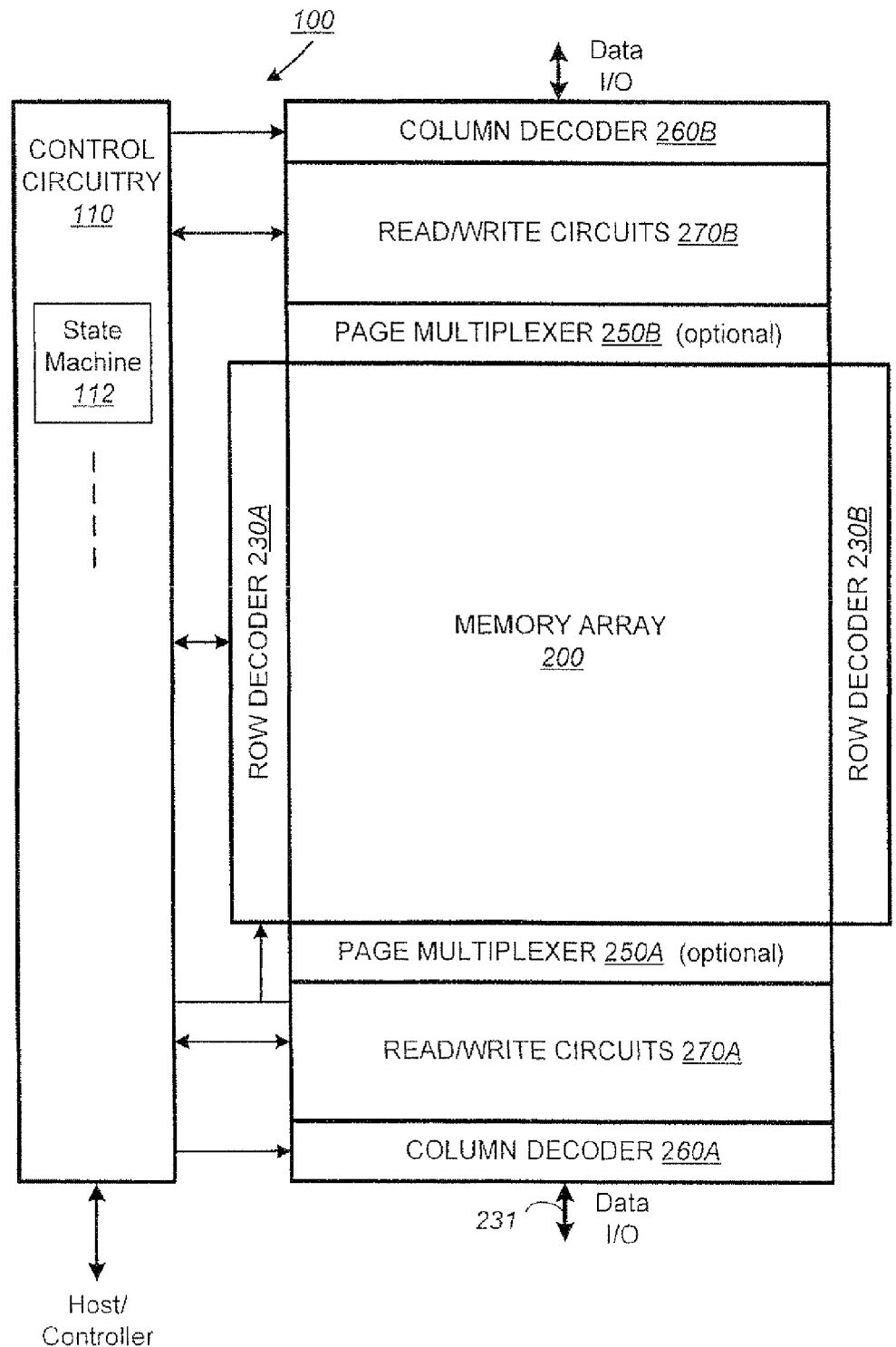
FIG. 1 illustrates schematically the functional blocks of a non-volatile memory chip in which the present invention may be implemented.

FIG. 1 illustrates schematically the functional blocks of a non-volatile memory chip in which the present invention may be implemented. The memory chip 100 includes a two-dimensional array of memory cells 200, control circuitry 210, and peripheral circuits such as decoders, read/write circuits and multiplexers.

Figure 4:
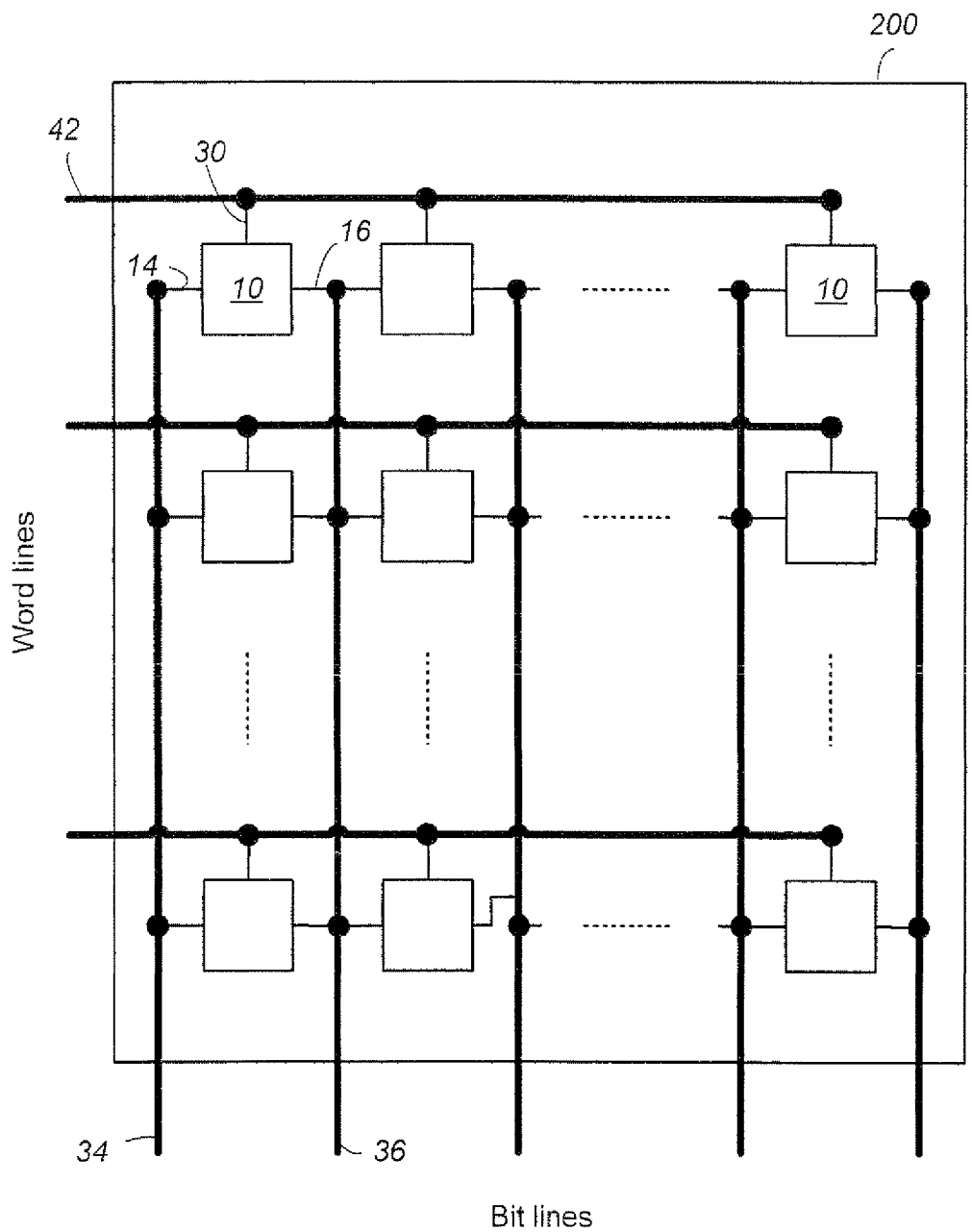
FIG. 4 illustrates an example of an NOR array of memory cells.

The memory array 200 is addressable by word lines via row decoders 230 (split into 230A, 230B) and by bit lines via column decoders 260 (split into 260A, 260B) (see also FIGS. 4 and 5.) The read/write circuits 270 (split into 270A, 270B) allow a page of memory cells to be read or programmed in parallel. A data I/O bus 231 is coupled to the read/write circuits 270.

In a preferred embodiment, a page is constituted from a contiguous row of memory cells sharing the same word line. In another embodiment, where a row of memory cells are partitioned into multiple pages, block multiplexers 250 (split into 250A and 250B) are provided to multiplex the read/write circuits 270 to the individual pages. For example, two pages, respectively formed by odd and even columns of memory cells are multiplexed to the read/write circuits.

FIG. 1 illustrates a preferred arrangement in which access to the memory array 200 by the various peripheral circuits is implemented in a symmetric fashion, on opposite sides of the array so that the densities of access lines and circuitry on each side are reduced in half. Thus, the row decoder is split into row decoders 230A and 230B and the column decoder into column decoders 260A and 260B. In the embodiment where a row of memory cells are partitioned into multiple pages, the page multiplexer 250 is split into page multiplexers 250A and 250B. Similarly, the read/write circuits 270 are split into read/write circuits 270A connecting to bit lines from the bottom and read/write circuits 270B connecting to bit lines from the top of the array 200. In this way, the density of the read/write modules, and therefore that of the sense modules 380, is essentially reduced by one half.

The control circuitry 110 is an on-chip controller that cooperates with the read/write circuits 270 to perform memory operations on the memory array 200. The control circuitry 110 typically includes a state machine 112 and other circuits such as an on-chip address decoder and a power control module (not shown explicitly). The state machine 112 provides chip level control of memory operations. The control circuitry is in communication with a host via an external memory controller.

The memory array 200 is typically organized as a two-dimensional array of memory cells arranged in rows and columns and addressable by word lines and bit lines. The array can be formed according to an NOR type or an NAND type architecture.

Figure 2:
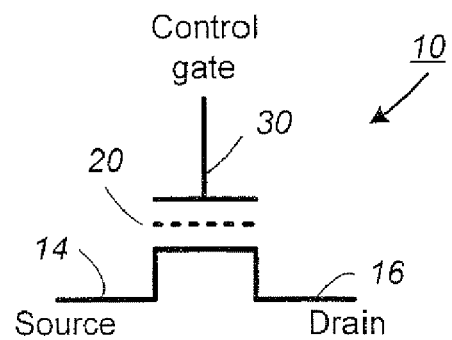
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661,053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line.

Figure 3:
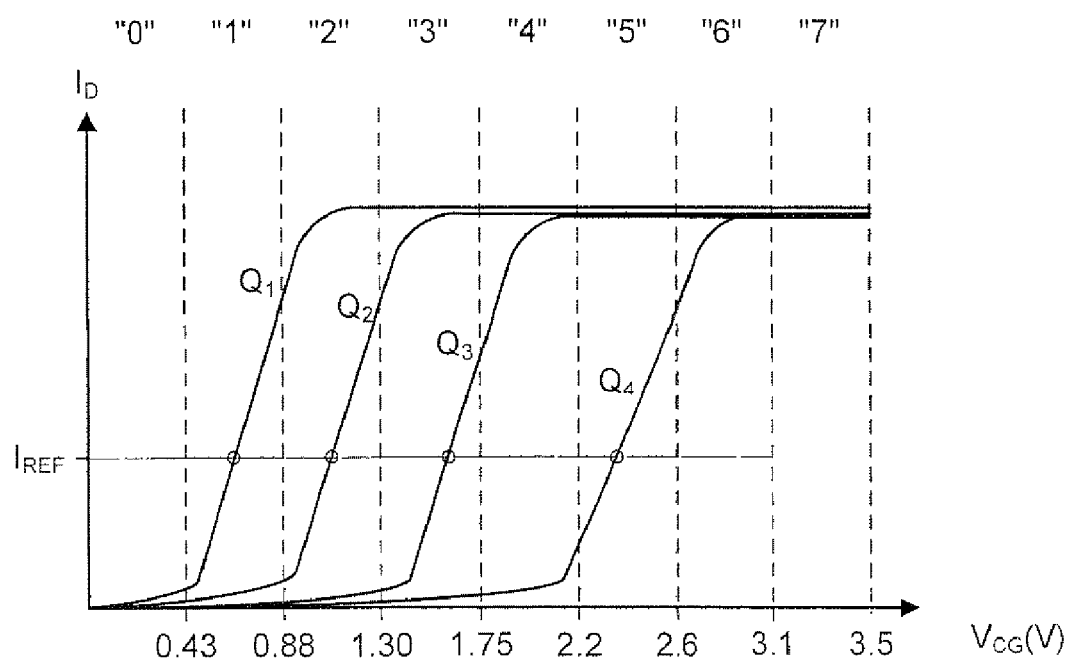
FIG. 3 illustrates the relation between the source-drain current $I_D$ and the control gate voltage $V_{CG}$ for four different charges Q1-Q4 that the floating gate may be selectively storing at any one time.

FIG. 3 illustrates the relation between the source-drain current $I_D$ and the control gate voltage $V_{CG}$ for four different charges Q1-Q4 that the floating gate may be selectively storing at any one time. The four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Eight possible memory states "0", "1", "2", "3", "4", "5", "6" and "7" respectively representing one erased and seven programmed states, may be demarcated by partitioning the threshold window into eight regions in interval of about 0.4V each. For example, if a reference current, IREF of 0.05 uA is used as shown, then the cell programmed with Q1 may be considered to be in a memory state "1" since its curve intersects with $I_{REF}$ in the region of the threshold window demarcated by VCG=0.43V and 0.88V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 350 mV to 450 mV in the threshold window. This will require higher precision in programming and reading operations in order to be able to achieve the required resolution.

FIG. 4 illustrates an example of an NOR array of memory cells. In the memory array 200, each row of memory cells are connected by their sources 14 and drains 16 in a daisy-chain manner. This design is sometimes referred to as a virtual ground design. The cells 10 in a row have their control gates 30 connected to a word line, such as word line 42. The cells in a column have their sources and drains respectively connected to selected bit lines, such as bit lines 34 and 36.

Figure 5A:
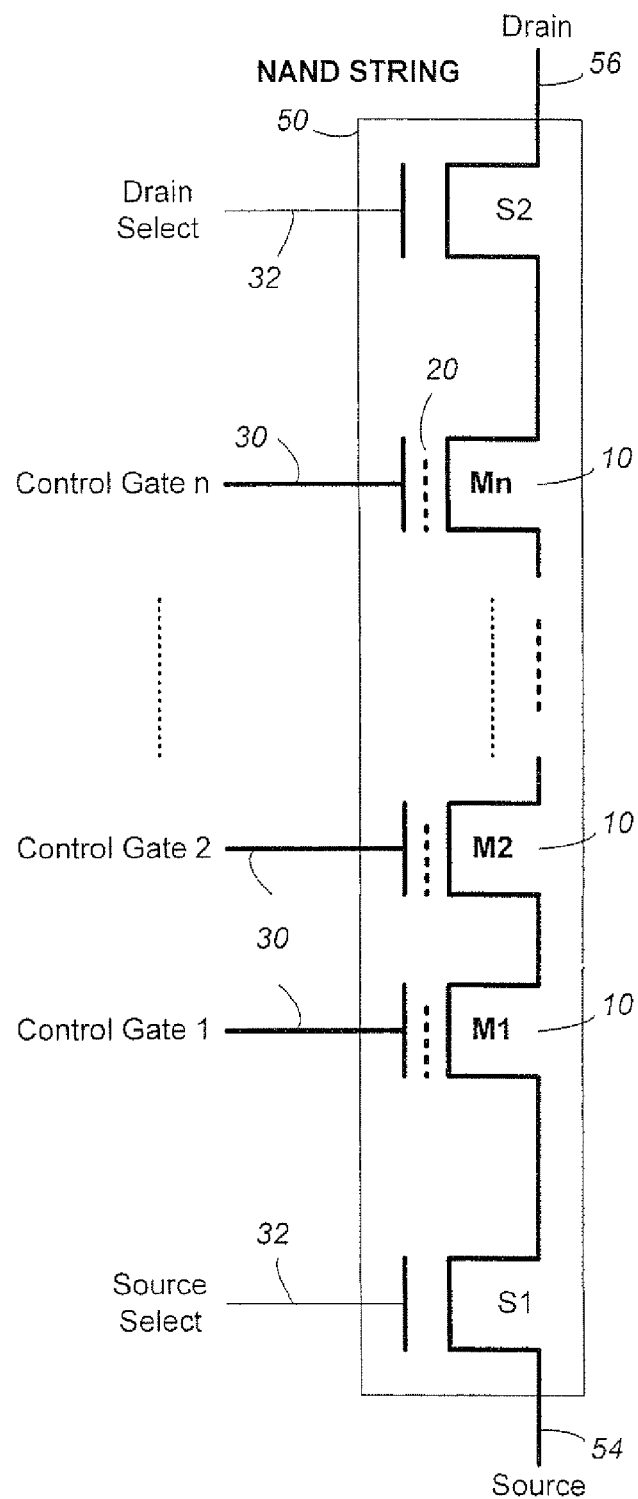
FIG. 5A illustrates schematically a string of memory cells organized into an NAND string.

FIG. 5A illustrates schematically a string of memory cells organized into an NAND string. An NAND string 50 comprises of a series of memory transistors M1, M2, . . . Mn (e.g., n=4, 8, 16 or higher) daisy-chained by their sources and drains. A pair of select transistors S1, S2 controls the memory transistors chain's connection to the external via the NAND string's source terminal 54 and drain terminal 56 respectively. In a memory array, when the source select transistor Si is turned on, the source terminal is coupled to a source line (see FIG. 5B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 5B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within an NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effective created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 5B:
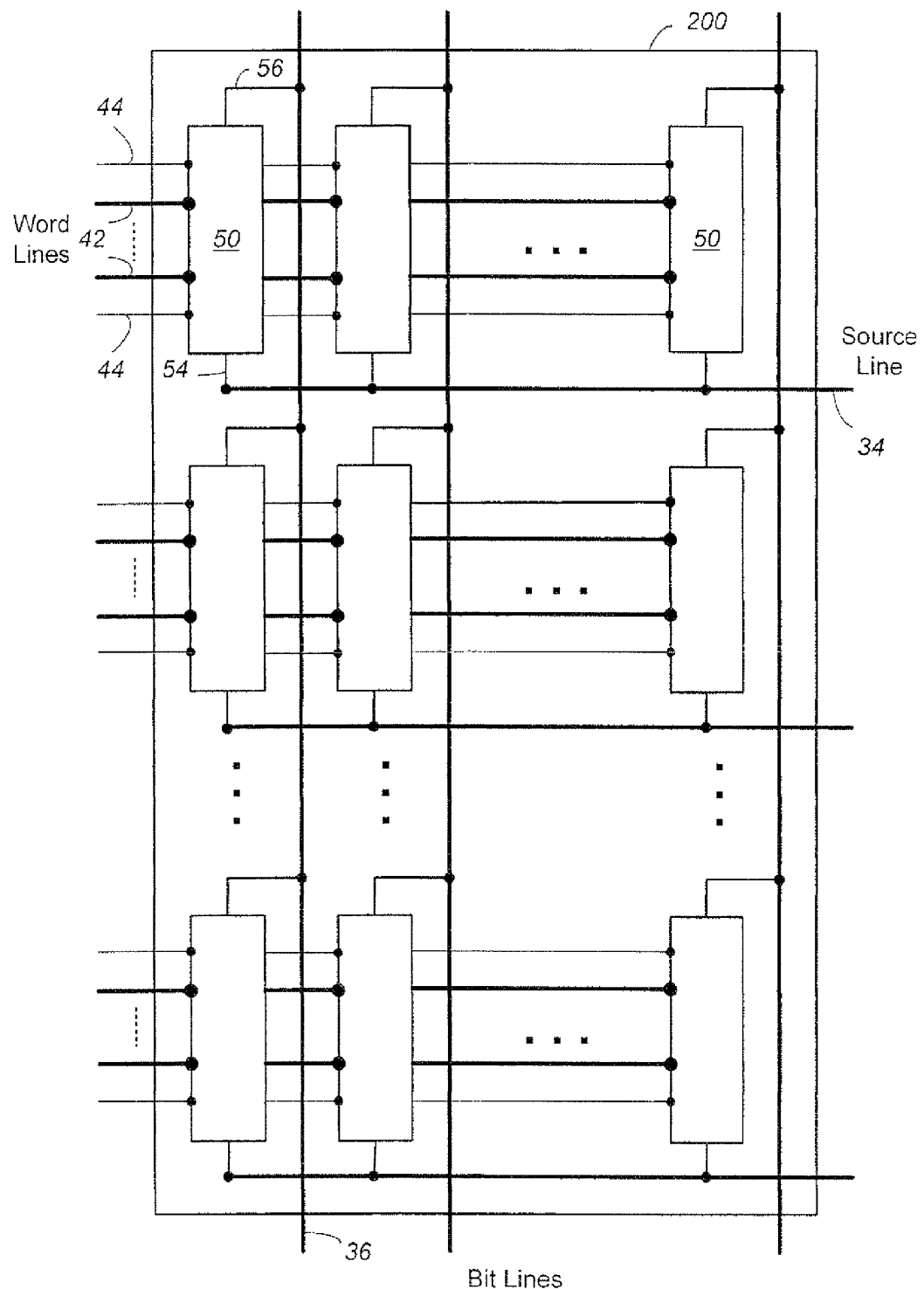
FIG. 5B illustrates an example of an NAND array of memory cells, constituted from NAND strings such as that shown in FIG. 5A.

FIG. 5B illustrates an example of an NAND array 200 of memory cells, constituted from NAND strings 50 such as that shown in FIG. 5A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings. When a memory transistor within a NAND string is being read, the remaining memory transistors in the string are turned on hard via their associated word lines so that the current flowing through the string is essentially dependent upon the level of charge stored in the cell being read.

Program and Verify

Figure 6:
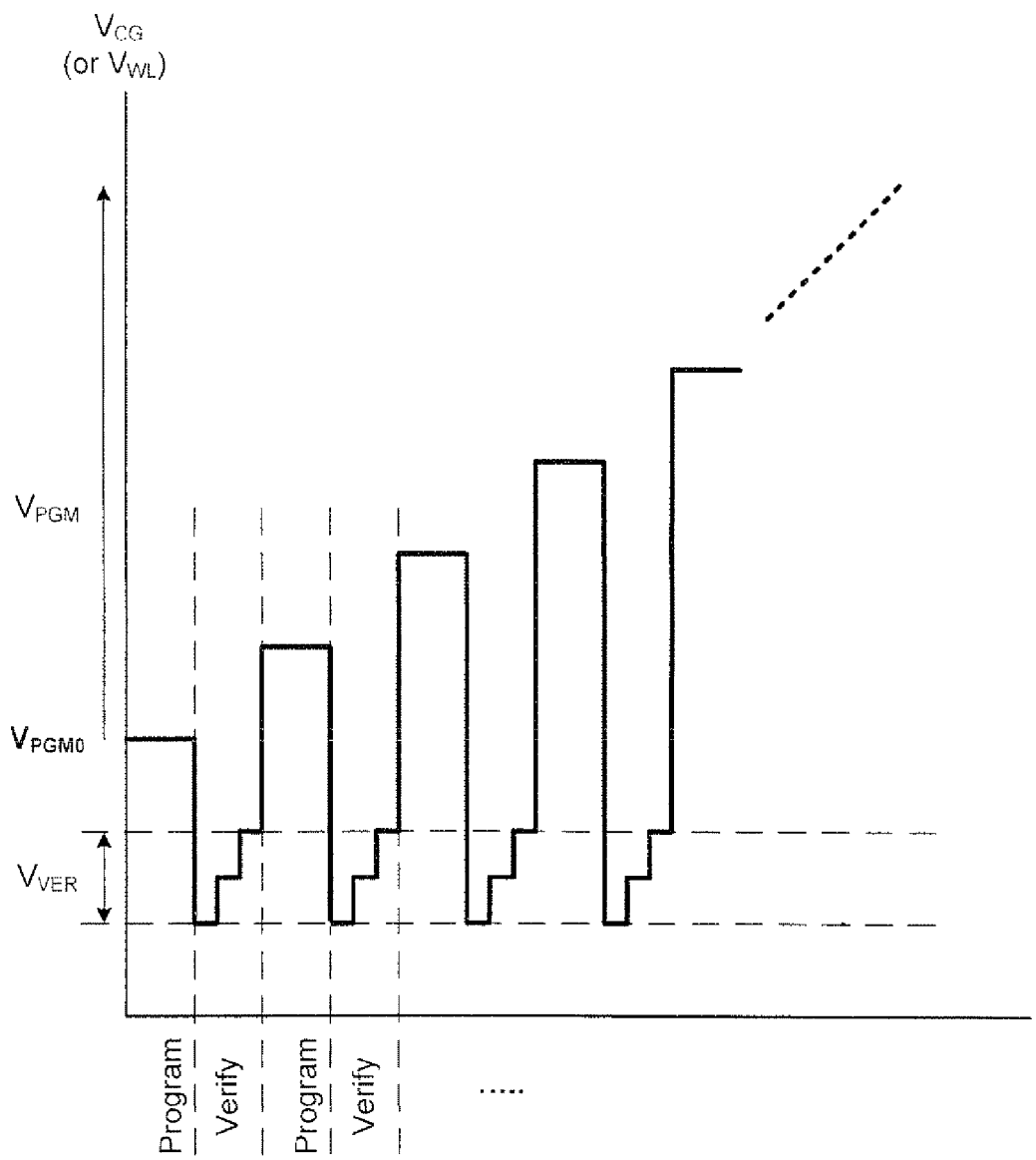
FIG. 6 illustrates a typical technique for programming a page of memory cells to a target memory state by a series of alternating program/verify cycles.

FIG. 6 illustrates a typical technique for programming a page of memory cells to a target memory state by a series of alternating program/verify cycles. A programming voltage $V_{PGM}$ is applied to the control gate of the memory cell via a coupled word line. The $V_{PGM}$ is a series of programming voltage pulses in the form of a staircase waveform starting from an initial voltage level, $V_{PGM0}$. The cell under programming is subject to this series of programming voltage pulses, with an attempt each time to add incremental charges to the floating gate. In between programming pulses, the cell is read back or verified to determine its source-drain current relative to a breakpoint level. The read back process may involve one or more sensing operation. Programming stops for the cell when it has been verified to reach the target state. The programming pulse train used may have increasing period or amplitude in order to counteract the accumulating electrons programmed into the charge storage unit of the memory cell. Programming circuits generally apply a series of programming pulses to a selected word line. In this Way, a page of memory cells whose control gates are coupled to the word line can be programmed together. Whenever a memory cell of the page has been programmed to its target state, it is program-inhibited while the other cells continue to be subject to programming until all cells of the page have been program-verified.

Examples of Memory State Partitioning

Figure 7:
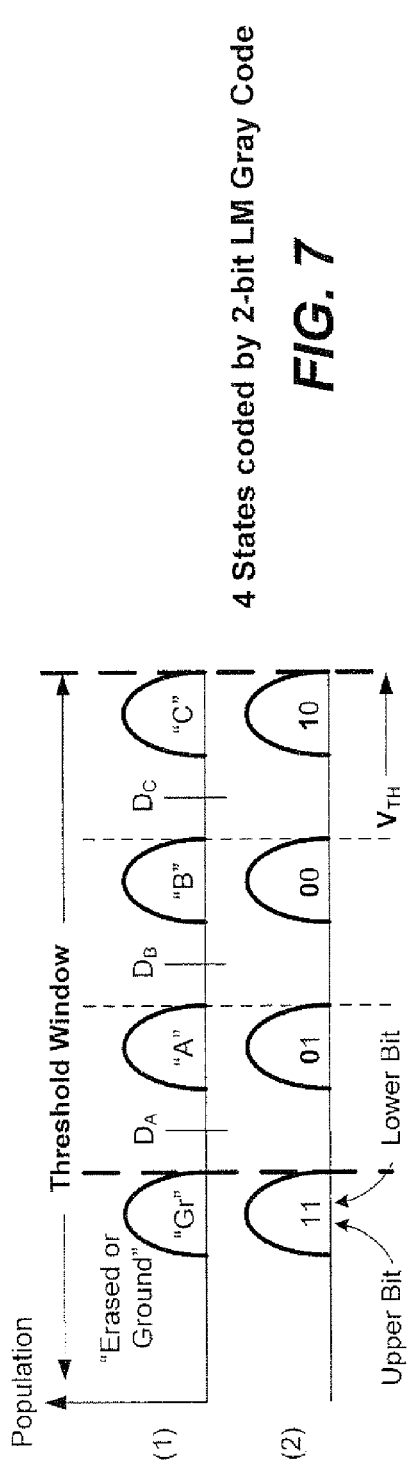
FIG. 7(1) illustrates the threshold voltage distributions of an example 4-state memory array with an erased state as a ground state "Gr" and progressively more programmed memory states "A", "B" and "C".

FIG. 7(1) illustrates the threshold voltage distributions of an example 4-state memory array with an erased state as a ground state "Gr" and progressively more programmed memory states "A", "B" and "C". During read, the four states are demarcated by three demarcation breakpoints, $D_A$-$D_C$.

FIG. 7(2) illustrates a preferred, 2-bit LM coding to represent the four possible memory states shown in FIG. 7(1). Each of the memory states (viz., "Gr", "A", "B" and "C") is represented by a pair of "upper, lower" code bits, namely "11", "01", "00" and "10" respectively. The "LM" code has been disclosed in U.S. Pat. No. 6,657,891 and is advantageous in reducing the field-effect coupling between adjacent floating gates by avoiding program operations that require a large change in charges. The coding is designed such that the 2 code bits, "lower" and "upper" bits, may be programmed and read separately. When programming the lower bit, the threshold level of the cell either remains in the "erased" region or is moved to a "lower middle" region of the threshold window. When programming the upper bit, the threshold level of a cell in either of these two regions is further advanced to a slightly higher level in a "lower intermediate" region of the threshold window.

Figure 8:
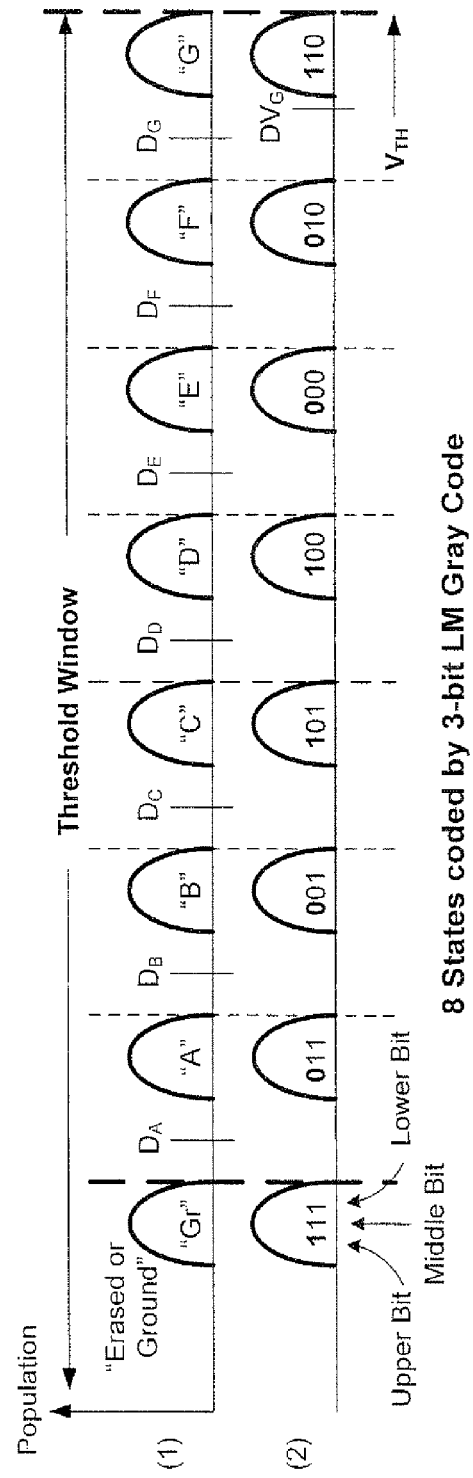
FIG. 8(1) illustrates the threshold voltage distributions of an example 8-state memory array.

FIG. 8(1) illustrates the threshold voltage distributions of an example 8-state memory array. The possible threshold voltages of each memory cell spans a threshold window which is partitioned into eight regions to demarcate eight possible memory states, "Gr", "A", "B", "C", "D", "E", "F" and "G". "Gr" is a ground state, which is an erased state within a tightened distribution and "A"-"G" are seven progressively programmed states. During read, the eight states are demarcated by seven demarcation breakpoints, $D_A$-$D_G$.

FIG. 8(2) illustrates a preferred, 3-bit LM coding to represent the eight possible memory states shown in FIG. 8(1). Each of the eight memory states is represented by a triplet of "upper, middle, lower" bits, namely "111", "011", "001", "101", "100", "000", "010" and "110" respectively. The coding is designed such that the 3 code bits, "lower", "middle" and "upper" bits, may be programmed and read separately. Thus, the first round, lower page programming has a cell remain in the "erased" or "Gr" state if the lower bit is "1" or programmed to a "lower intermediate" state if the lower bit is "0". Basically, the "Gr" or "ground" state is the "erased" state with a tightened distribution by having the deeply erased states programmed to within a narrow range of threshold values. The "lower intermediate" states may have a broad distribution of threshold voltages that straddling between memory states "B" and "D". During programming, the "lower intermediate" state can be verified relative to a coarse breakpoint threshold level such as $D_B$. When programming the middle bit, the threshold level of a cell will start from one of the two regions resulted from the lower page programming and move to one of four possible regions. When programming the upper bit, the threshold level of a cell will start from one of the four possible regions resulted from the middle page programming and move to one of eight possible memory states.

Sensing Circuits and Techniques

Figure 9:
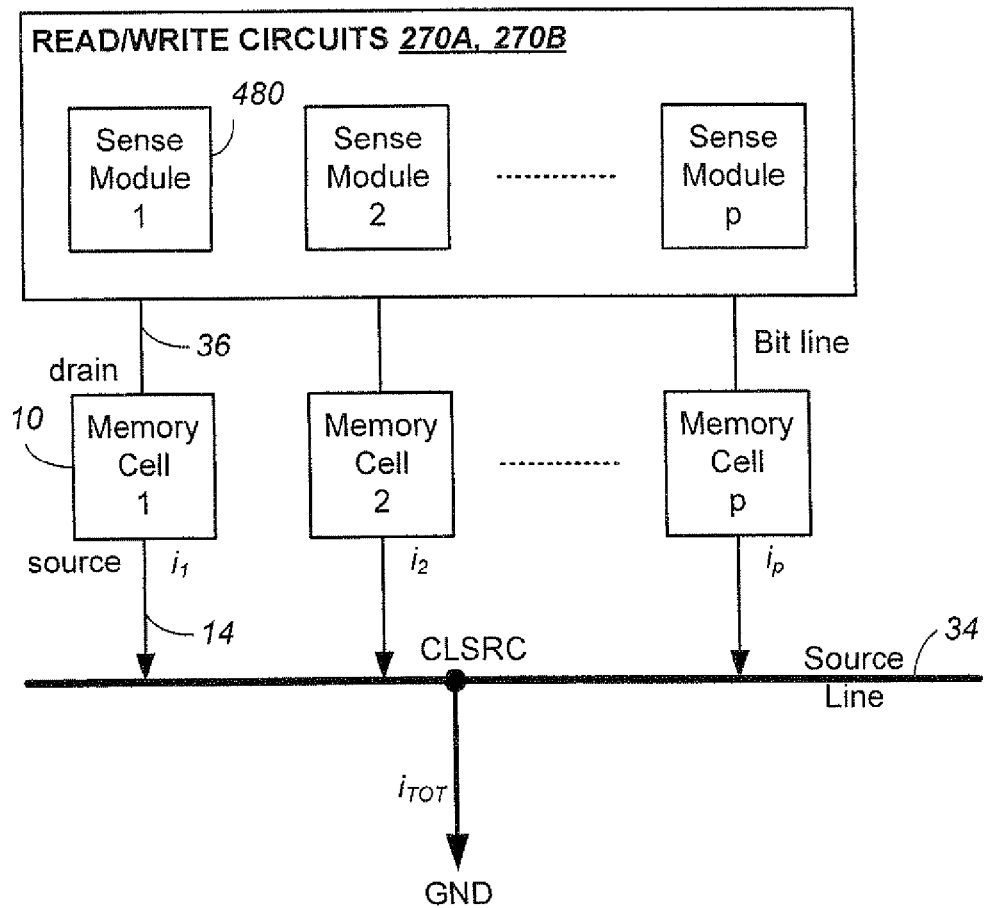
FIG. 9 illustrates the Read/Write Circuits, shown in FIG. 1, containing a bank of sense modules across an array of memory cells.

FIG. 9 illustrates the Read/Write Circuits 270A and 270B, shown in FIG. 1, containing a bank of p sense modules across an array of memory cells. The entire bank of p sense modules 480 operating in parallel allows a block (or page) of p cells 10 along a row to be read or programmed in parallel. Essentially, sense module 1 will sense a current $I_1$ in cell 1, sense module 2 will sense a current $I_2$ in cell 2, . . . , sense module p will sense a current $I_p$ in cell p, etc. The total cell current $i_{TOT}$ for the page flowing oat of the source line 34 into an aggregate node CLSRC and from there to ground will be a summation of all the currents in the p cells. In conventional memory architecture, a row of memory cells with a common word line forms two or more pages, where the memory cells in a page are read and programmed in parallel. In the case of a row with two pages, one page is accessed by even bit lines and the other page is accessed by odd bit lines. A page of sensing circuits is coupled to either the even bit lines or to the odd bit lines at any one time. In that case, page multiplexers 250A and 250B are provided to multiplex the read/write circuits 270A and 270B respectively to the individual pages.

In currently produced chips based on 56 nm technology p>64000 and in the 43 nm 32 Gbit×4 chip p>150000. In the preferred embodiment, the block is a run of the entire row of cells. This is the so-called "all bit-line" architecture in which the page is constituted from a row of contiguous memory cells coupled respectively to contiguous bit lines. In another embodiment, the block is a subset of cells in the row. For example, the subset of cells could be one half of the entire row or one quarter of the entire row. The subset of cells could be a run of contiguous cells or one every other cell, or one every predetermined number of cells. Each sense module is coupled to a memory cell via a bit line and includes a sense amplifier for sensing the conduction current of a memory cell. In general, if the Read/Write Circuits are distributed on opposite sides of the memory array the bank of p sense modules will be distributed between the two sets of Read/Write Circuits 270A and 270B.

Figure 10:
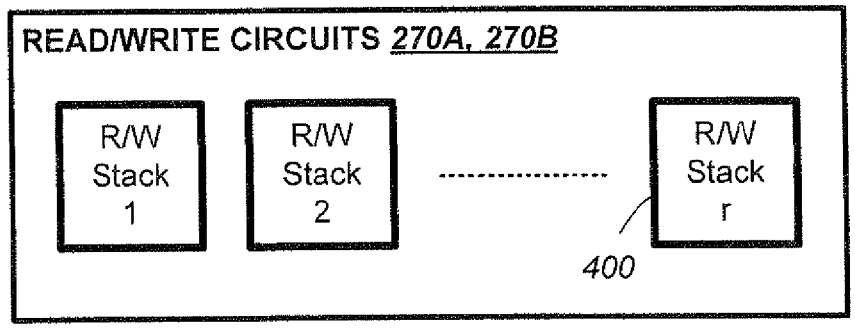
FIG. 10 illustrates schematically a preferred organization of the sense modules shown in FIG. 9.

FIG. 10 illustrates schematically a preferred organization of the sense modules shown in FIG. 9. The read/write circuits 270A and 270B containing p sense modules are grouped into a bank of read/write stacks 400.

Figure 11:
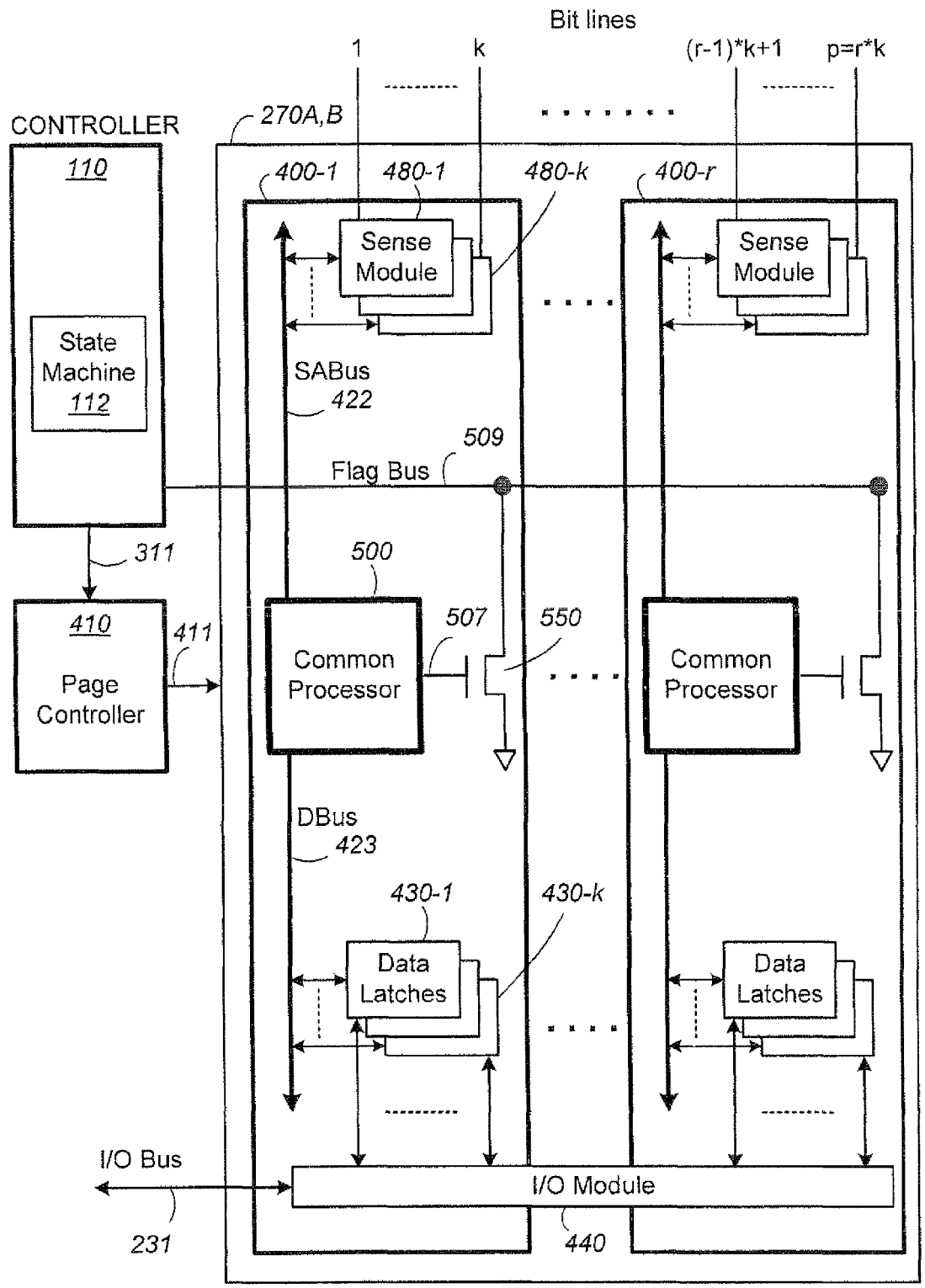
FIG. 11 illustrates in more detail the read/write stacks shown in FIG. 10.

FIG. 11 illustrates in more detail the read/write stacks shown in FIG. 10. Each read/write stack 400 operates on a group of k bit lines in parallel. If a page has p=r*k bit lines, there will be r read/write stacks, 400-1, . . . , 400-r. Essentially, the architecture is such that each stack of k sense modules is serviced by a common processor 500 in order to save space. The common processor 500 computes updated data to be stored in the latches located at the sense modules 480 and at the data latches 430 based on the current values in those latches and on controls from the state machine 112. Detailed description of the common processor has been disclosed in U.S. Patent Application Publication Number: US-2006-0140007-A1 on Jun. 29, 2006, the entire disclosure of which is incorporated herein by reference.

The entire bank of partitioned read/write stacks 400 operating in parallel allows a block (or page) of p cells along a row to be read or programmed in parallel. Thus, there will be p read/write modules for the entire row of cells. As each stack is serving k memory cells, the total number of read/write stacks in the bank is therefore given by r=p/k. For example, if r is the number of stacks in the bank, then p=r*k. One example memory array may have p=150000, k=8, and therefore r=18750.

Each read/write stack, such as 400-1, essentially contains a stack of sense modules 480-1 to 480-k servicing a segment of k memory cells in parallel. The page controller 410 provides control and timing signals to the read/write circuit 370 via lines 411. The page controller is itself dependent on the memory controller 310 via lines 311. Communication among each read/write stack 400 is effected by an interconnecting stack bus 431 and controlled by the page controller 410. Control lines 411 provide control and clock signals from the page controller 410 to the components of the read/write stacks 400-1.

In the preferred arrangement, the stack bus is partitioned into a SABus 422 for communication between the common processor 500 and the stack of sense modules 480, and a DBus 423 for communication between the processor and the stack of data latches 430.

The stack of data latches 430 comprises of data latches 430-1 to 430-k, one for each memory cell associated with the stack The I/O module 440 enables the data latches to exchange data with the external via an I/O bus 231.

The common processor also includes an output 507 for output of a status signal indicating a status of the memory operation, such as an error condition. The status signal is used to drive the gate of an n-transistor 550 that is tied to a FLAG BUS 509 in a Wired-Or configuration. The FLAG BUS is preferably precharged by the controller 310 and will be pulled down when a status signal is asserted by any of the read/write stacks.

Low Noise Sense Module Array

U.S. Pat. No. 7,046,568 discloses a non-volatile memory device with low noise sensing circuits capable of operating at a low supply voltage. The entire disclosure of U.S. Pat. No. 7,046,568 is incorporated herein by reference.

Unlike previous sensing circuits, the low noise sensing circuit of U.S. Pat. No. 7,046,568 measures the cell current by the rate it discharges a dedicated capacitor rather than the bit line acting as a capacitor. In this way, the bit line voltage can be kept constant during sensing, thereby avoid noises from bit-line to bit-line coupling due to time-varying voltages on the bit lines. The sensing circuit is also capable of operating with a low supply voltage by incorporating a voltage boasting circuit that effectively expands the dynamic range of the voltage discharge used for determining the cell current.

According to one aspect of the present invention, a page of memory cell is sensed in parallel by a corresponding array of sense modules, and noise generated in a sense module for a given memory cell is prevented from interfering with other sense modules in the array. In particular an existing sense module becomes a significant source of noise to other sense modules in the array after it has identified and locked out a highly conducting memory cell of the page. The present invention prevents a sense module associated with a locked-out memory cell from propagating noise to the other sense modules still sensing in the array. In this way, sensing accuracy is improved resulting in better performance and allowing more data bits to be stored in each memory cell.

FIG. 12A illustrates schematically an existing implementation of the sense modules shown in. FIGS. 9 to 11. The existing sense module 480' is similar to ones disclosed in U.S. Pat. No. 7,046,568. It will be understood that each Read/Write Stack 400 shown in FIG. 10 contains a set of k sense modules servicing corresponding k memory cells via k bit lines. There will be k sense modules 480-1 to 480-k, and k data latches 430-1 to 430-k serviced by one common processor 500. For simplicity sake, FIG. 12A shows explicitly one of the sense modules 480', representative of anyone of the set of k sense modules 480-1 to 480-k, and one set of data latches 430, representative of anyone of the set of k data latches 430- to 430-k in operation with the common processor 500. As described in connection with FIGS. 10 and 11, a page of p memory cells is served by operating a total of r Read/Write stacks in parallel.

The existing sense module 480' is coupled to a memory cell via a bit line 36 via a coupling transistor 482 which is controlled by a signal BLS. An example of the memory cell is a memory transistor among a NAND chain 50. The sense module 480' includes a sense amplifier 600', a bit line voltage clamp 610 and a pull-down circuit 550. The sense module 480' communicates with other peripheral circuits using a bus such as the SA Bus 422 via a transfer gate 488 which is controlled by a signal NC0.

As described earlier, a slack of sense modules communicate via the SA Bus 422 with the common processor 500 and a set of data latches 430. The common processor 500 accesses data stored in the latches of the sense modules 480' and in the data latches 430. It computes updated values based on their current values and on controls from the state machine 112. The updated values are stored back to the latches in the sense module 480' and/or data latches 430. The common processor 500 is coupled to the k data latches via the Dbus 423. The set of data latches 430 is connected to the outside via an I/O bus 231. Operations of the sense module 480', the common processor 500 and the set of data latches 430 are controlled by the state machine 112 (see FIG. 11) via the page controller 410 which issues control and timing signals through control lines 411.

The sense module 480' has a node 481 carrying a signal COM1. The node 481 allows the sense amplifier 600' to be selectively coupled to the bit line 36 and/or the SA bus 422.

Sensing is performed with the bit line 36 at a fixed voltage clamped by the bit line voltage clamp 610. The bit line voltage clamp is implemented by an n-transistor 612 with its source and drain in series between the bit line and the COM1 node 481. An analog voltage on the gate of the n-transistor 612 determines the clamped voltage on the bit line. During sensing operations, the constant bit line voltage eliminates possible coupling between bit lines due to varying voltages on the bit lines.

When a memory cell of a page is determined to have a conduction current higher than a reference current, the sensing for that cell is done and the cell is locked out from further sensing operations while the rest of the page may continue to be sensed. This is accomplished by turning off the cell current by pulling down the bit line 36 to ground. A pull-down circuit 550 is provided for selectively pulling the bit line 36 to ground. The pull-down circuit 550 includes two n-transistors 552 and 486 in series across essentially the bit line and the ground. The two n-transistors are controlled respectively by the signals GRS and INV. When both are HIGH, the pull-down circuit 550 is activated and pulls the node 481 (COM1) to ground. When the signal BLS is also HIGH, the bit line 36 is also pulled to ground. In this way, the cell current is turned off due to the shorting of its source and drain.

The signal GRS is used during programming and is controlled from the state machine 112 (see FIG. 11) and is supplied as part of the control and timing signals from the page controller 411. During sensing, GRS is always HIGH, and the signal INV is also set to be HIGH by the sense amplifier 600' when it senses the cell current to be higher than a reference current.

The sense amplifier 600' includes a voltage clamp 620, a precharge circuit 640', a cell current discriminator 650 and a sense amplifier latch 660. Sensing is performed by detecting the signal SEN at a node 631 by the cell current discriminator 650. The SEN node 631 can be precharged by the precharge circuit 640' via an isolation transistor 642 controlled by a signal HLL. Then SEN node 631 can also be coupled to the memory cell when it is coupled to the COM1 node 481 via an isolation transistor 630 controlled by a signal XXL.

The voltage clamp 620 is implemented by a transistor 622 between the precharge circuit and the COM1 node 481. The transistor 622 is driven by a signal BLX for keeping the signal COM1 at node 481 above a predetermined level in order for the bit line voltage clamp 610 to function properly.

The precharge circuit 640' allows the bit line via the COM1 node 481 and a SEN node 631 to be pulled up towards Vdd during various operations of the sense module. The precharge circuit 640' is implemented by a p-transistor 644 enabled by a signal INV.

The isolation transistor 630 between the SEN node 631 and the COM1 node 481 allows different voltages to exist on the two nodes. When the bit line 36 needs to be precharged to a given voltage, it can be pulled up via the path enabled by the transistors 482, 612, 630, 642 and 644 respectively controlled by the signals BLS, BLC, XXL, HLL and INV. Similarly, the COM1 signal at the node 481 and the SEN signal at the node 631 can be pulled up essentially to Vdd, respectively controlled by the signals XXL, HLL and INV.

In some implementations, Vdd is supplied directly from an external source Vext prior to conversion to a lower value. This can provide 100 mV extra margin for the pulled up voltage and is especially useful in the case of sensing the memory cell in a region of negative $V_T$s.

The cell current discriminator 650 essentially compares the conduction current of the memory cell relative to a reference current. When the cell current is higher than the reference current, the sense amplifier outputs the signal INV in the HIGH state and vice versa. Once set, the signal INV is latched by the sense amplifier latch 660.

Prior to sensing, the voltages to the electrodes of the selected memory cell must be set via the appropriate word lines and bit line in one or more precharge operation.

For example, as shown in FIG. 12A, a page of memory cells along a word line WL1 intersecting the NAND chain 50 may be selected for sensing. The precharge operation starts with the unselected word lines WL0, WL2-WL31 being charged to a voltage Vread and the selected world line WL1 being charged to a predetermined threshold voltage $V_T(i)$ for a given memory state under consideration.

The bit line 36 and the COM1 node 481, the SEN node 631 are precharged by the precharge circuit 640' to predetermined voltages respectively appropriate for sensing. With the application of the word lines and bit line voltages to the NAND chain 50, a selected memory cell will be turned on. A source-drain conduction current will flow in the memory cell. The conduction current is a function of the charge programmed into the selected memory cell and the applied $V_T(i)$ to the selected word line when there exists a nominal voltage difference between the source and drain of the memory cell.

When the voltages on the word lines and bit line are stable, the conduction current or the programmed threshold voltage of the selected memory cell can be sensed by the sense amplifier 600' at the SEN node The cell current discriminator 650 essentially measures the cell current by detecting the rate the cell current is discharging the signal SEN on a capacitor 652 at the node 631. Thus, determination of the rate of SEN being discharge will provide a measure of the conduction current. Prior to the discharge, SEN is precharged to Vdd by the precharge circuit 640'. Sensing is over a predefined period given by the time the cell current is allowed to discharge the capacitor (HLL LOW and XXL HIGH) to the time the cell current is cut off (XXL LOW.)

During sensing, the conduction current of the memory storage unit in the bit line will discharge the capacitor 652. The more conducting the cell, the faster the discharge. The voltage in the SEN node 631 will then decrease from $V_{dd}$ at a rate depending on the conduction current. At the end of the predefined discharging period, the isolation transistor 630 is turned off by XXL going LOW (the period being corresponding to a reference current.) This will disconnect the cell current from the SEN node 631 and halt further discharge. The signal SEN will drop to some value that may or may not turn off the measuring p-transistor 656.

After the sensing period, the voltage in the signal SEN is compared against the threshold (Vdd–|$V_T$|) of a p-transistor ($V_{TP}$ being the threshold voltage of the p-transistor). SEN is applied to the gate of a p-transistor 656. If the p-transistor is turned on, SEN is has discharged below Vdd–|$V_T$| or the conduction current is greater than a reference current. If the p-transistor is not turned on, the conduction current is less than the reference current that it fails to discharge SEN below Vdd–|$V_T$|.

The source side of the p-transistor 656 is connected to Vdd when a connecting transistor 654 is turned on with a gate signal STB. If SEN has not dropped sufficiently low to turn on the p-transistor 656, a node 657 outputting the signal INV at the drain side of the transistor 656 will remain LOW. On the other hand, if SEN has dropped below Vdd–|$V_{TP}$|, the p-transistor 656 will be turned on and the INV node 657 will be pulled up to Vdd and latched.

The cell current discriminator 650 effectively determines whether the cell's conduction current is higher or lower than a given demarcation current value. The given demarcation current value corresponds to a predetermined discharge time. If the sensed current is higher than the demarcation current value, the memory cell in question has a threshold value less than the applied $V_T(i)$ at the control gate. Thus, the sensed result in the form of INV remains LOW when the cell current is lower than the reference demarcation level. Conversely, INV is HIGH when the cell current is higher than the reference level. The INV signal is converted to a CMOS logic level as latched by the sense amplifier latch 660.

Voltage Boosting Circuit

It will be seen from FIG. 12A and the description earlier that if the bit line voltage is clamped at a predetermined $V_{BL}$ by the bit line clamp 610, then the drain side of the clamping n-transistor 612 must be at a slightly higher voltage (e.g., by about 0.2V) than the source side for the clamp to be functional. Thus COM1 must be higher than $V_{BL}$ by about 0.2V and this is guaranteed by the voltage clamp 621 This also means that the voltage level of SEN can at most drop to within a $V_T$ above COM1. Thus, the discharge of the SEN signal at the node 631 can only operate with a limited dynamic range with a ceiling given by Vdd and a floor given by $V_{LIMIT}$ which is slightly higher (e.g., by about $V_T$) than COM1. However, for lower supply voltage which is the source of Vdd, given the existence of $V_{LIMIT}$, if (Vdd–|$V_{TP}$|)<$V_{LIMIT}$, then the p-transistor would never turn on.

The compare circuit 650' is adapted for low voltage operation by providing a voltage boosting circuit in the form of a voltage shifter 700 to supply a boost voltage $V_B$ via a line 703 to one plate of the capacitor 652. The timing of the voltage shifter is controlled by the page controller 498 via a line 702.

In operation, the precharge circuit 640' pulls the sense node SEN 631 to Vdd. The voltage shifter is activated after the node SEN has been decoupled from Vdd by the isolation transistor 636. The voltage shifter basically has the $V_B$ signal level augment by $\Delta V$, so that the voltage on the other plate of the capacitor at node SEN 631 will be boosted by an equal amount. This effectively increases the upper limit of the dynamic range by $\Delta V$ so that the final voltage corresponding to a moderate conduction current can be higher than Vdd–$V_{LIMIT}$. At the end of the discharging period, the sense node SEN 631 is decoupled from the node SEN2 through the isolation transistor 634 thereby removing the $V_{LIMIT}$ restriction. The voltage on SEN 631 is then reduced by the same $\Delta V$ to cancel the initial boosting before being compared to the reference voltage (Vdd−|$V_{TP}$|). This enables the voltage comparison to be made at a level even below the $V_{LIMIT}$.

Noise from Lockout Sense Modules to Other Sense Modules

The voltage boosting circuit 700 steps up $V_B$ during the sensing period and can therefore become a noise source in the sense module 480'. The noise can propagate via the capacitor 652 to the SEN node 631 and beyond. The noise is not significant when the sense module is active in a sensing operation as the cell is acting as a current sink and the both the bit line voltage clamp 610 and the voltage clamp 620 in the sense amplifier are in operation to mitigate the noise.

As described earlier, the sense module enters into a lockout mode after it has detected a high current cell and latched the signal INV at HIGH. This causes the cell current to be shut down after its bit line is pulled down to ground by the pull-down circuit 550. The lockout sense module no longer participates in sensing and becomes inactive while other sense modules continue to be active in sensing the not-yet-lockout memory cells in the page. However, the lockout sense module, even in its inactive mode, becomes a significant noise source for the other sense modules that are still active.

FIG. 12B illustrates the noise path of the sense module shown in FIG. 12A that has entered into a lockout mode. The lockout mode is when the sense amplifier 600' has detected a cell current above a reference current and sets the signal INV at HIGH. Responsive to NV being HIGH, the sense module 480' pulls down the bit line to ground while access to Vdd via the precharge circuit 640' is cut off. This means the voltage clamp 620 and therefore also the bit line voltage clamp 610 can no longer function. When a page of memory cells is being sensed in parallel, the control signals such as XXL and BLS and $V_B$ are uniformly applied to all the sense modules, including those sense modules that have entered into the lockout mode. Thus, for the sense module 480' with INV being HIGH, the noise generated by the voltage boosting circuit 700 can propagate along a path 711 to the bit line 36. If the source of each memory cell in the page is coupled to a page source line with the signal CLSRC, and the page source line is couple to ground, the noise can also propagate to affect CLSRC via a ground loop.

FIG. 13 illustrates the timing of the control signals for the existing sense module shown in FIG. 12B that has entered the lockout mode. In the lockout mode the sense module 480' allows the noise from the voltage boosting circuit 700 to reach the page source line as well as the bit line. Referring to both FIG. 13 and FIG. 12B, the sensing period for all sense modules starts with HLL (FIG. 13(*a*)) cutting off the precharge circuit 640' from the SEN node 631 and ends with XXL (FIG. 13(*b*)) cutting off the cell current from further discharging the SEN node. During the sensing period, the sense node is boosted with $V_B$ supplied from the voltage boosting circuit. For the sense module in the lockout mode, the SEN node 631 is coupled to the bit line 36 which is also coupled to the CLSRC page source line 34 via the pulldown circuit 550. With the cell current turned off, the abrupt shift in voltage level of $V_B$ at the beginning of the sensing period (FIG. 13(*c*)) causes a ripple at the SEN node (FIG. 13(*d*)). This ripple propagates as noise along the noise path 711 to reach the coupled bit line (FIG. 13(*e*)) and the CLSRC page source line (FIG. 13(*f*)).

Effect of Noise on a Bit Line

The sense module 480' was designed to sense at constant bit line voltage so as to avoid coupling of time varying current from one bit line to another. Any current extraneous to the cell current will be just noise and contribute to error in the sensing of the cell current. As explained above, the lockout sense module can dump noise which is a time varying current into the lockout bit line. Even though the lockout memory cell is no longer being sensed, the varying current in the lockout bit line can be coupled to neighboring bit lines, whose cells may still be undergoing sensing. This type of coupling noise is significant for cells being sensed close to a lockout cell and contributes to errors in sensing.

Effect of Noise on a Page Source Line

Another issue has to do with an error introduced by the uncertainty in the source side voltage of a memory cell. For example, one manifestation of source side error is due to a finite resistance between the source line and the ground pad of the chip. One potential problem with sensing memory cells is source line bias caused by source loading across the finite resistance. When a large number memory cells are sensed in parallel, their combined currents can result in significant voltage drop in a ground loop with finite resistance. This results in a source line bias which causes error in a read operation employing threshold voltage sensing.

Figure 14:
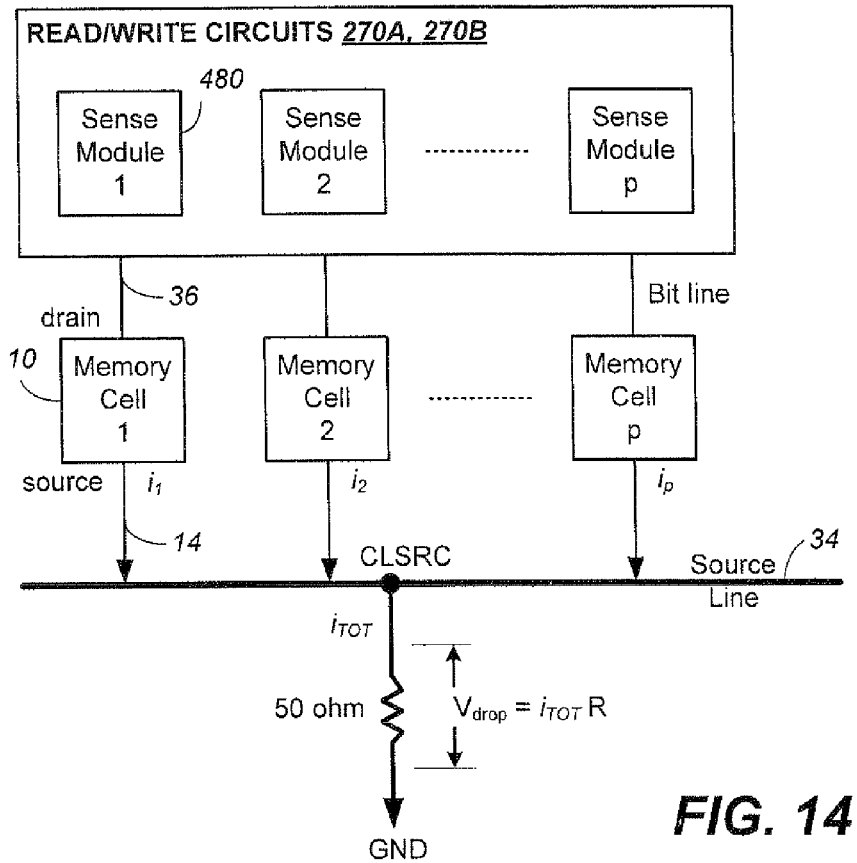
FIG. 14 illustrates the problem of source voltage error due to current flow in the source line having a finite resistance to ground.

FIG. 14 illustrates the problem of source voltage error due to current flow in the source line having a finite resistance to ground. The read/write circuits 270A and 270B operate on a page of memory cells simultaneously. Each sense modules 480 in the read/write circuits is coupled to a corresponding cell via a bit line 36. For example, a sense module 480 senses the conduction current $i_1$ (source-drain current) of a memory cell 10. The conduction current flows from the sense module through the bit line 36 into the drain of the memory cell 10 and out from the source 14 before going through a source line 34 to ground. In an integrated circuit chip, the sources of the cells in a memory array are all tied together as multiple branches of the source line 34 connected to some external ground pad (e.g. Vss pad) of the memory chip. Even when metal strapping is used to reduce the resistance of the source line, a finite resistance, R, remains between the source electrode of a memory cell and the ground pad. Typically, the ground loop resistance R is around 50 ohm.

For the entire page of memory being sensed in parallel, the total current flowing through the source line 34 is the sum of all the conduction currents, i.e. $i_{TOT} = i_1 i_2 + \ldots, + i_p$. Generally each memory cell has a conduction current dependent on the amount of charge programmed into its charge storage element. For a given control gate voltage of the memory cell, a small charge will yield a comparatively higher conduction current (see FIG. 3.) When a finite resistance exists between the source electrode of a memory cell and the ground pad, the voltage drop across the resistance is given by $V_{drop} = i_{TOT} R$.

For example, if 24000 bit lines discharge at the same time, each with a current of 0.25 µA, then the source line voltage drop will be equal to 24000 lines×0.25 µA/line×50 ohms~0.3 volts. This source line bias will contribute to a sensing error of 0.45 volts when threshold voltages of the memory cells are sensed, assuming that the body effect is such that 0.3V rise in source voltage results in a 0.45V rise in threshold voltage.

Figure 15:
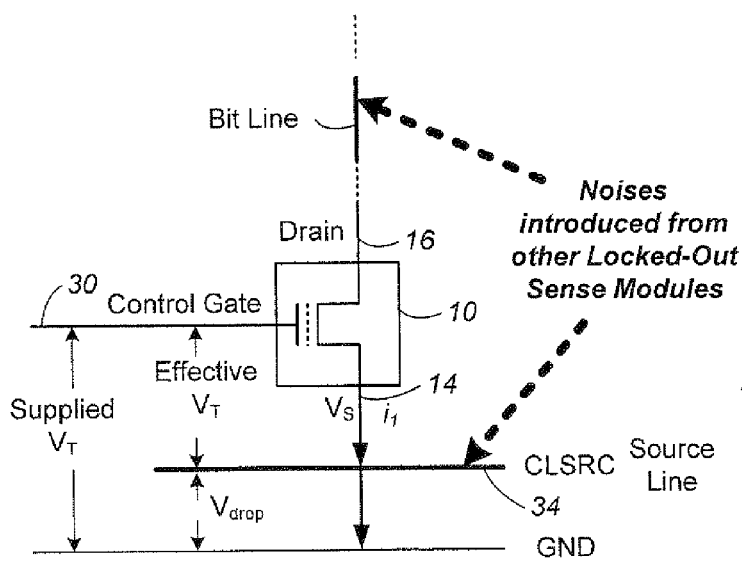
FIG. 15 illustrates the error in the threshold voltage level of a memory cell caused by a source line voltage drop.

FIG. 15 illustrates the error in the threshold voltage level of a memory cell caused by a source line voltage drop. The threshold voltage $V_T$ supplied to the control gate 30 of the memory cell 10 is relative to GND. However, the effective $V_T$ seen by the memory cell is the voltage difference between its control gate 30 and source 14. There is a difference of approximately 1.5×$V_{drop}$ between the supplied and effective $V_T$ (ignoring the smaller contribution of voltage drop from the source 14 to the source line.) This $V_{drop}$ or source line bias will contribute to a sensing error of, for example 0.45 volts when threshold voltages of the memory cells are sensed. This bias cannot be easily removed as it is data-dependent, i.e., dependent on the memory states of the memory cells of the page.

U.S. Pat. No. 7,173,854 discloses a method of referencing the word line voltage close to the source of each memory cell in a page so as to alleviate the problem of source bias error due to the ground loop.

U.S. patent application Ser. No. 11/771,982, filed Jun. 29, 2007 by Nguyen et al., entitled "METHOD FOR SENSING NEGATIVE THRESHOLD VOLTAGES IN NON-VOLATILE STORAGE USING CURRENT SENSING" discloses a memory device and method for regulating the source of each memory cell along a page to a predetermined page source voltage. The entire disclosure of U.S. patent application Ser. No. 11/771,982 is incorporated herein by reference.

FIG. 15 also illustrates schematically, that noise due to lockout sense modules is introduced to both the page source line and the bit lines of individual sense modules undergoing sensing. The noise typically has a rapid fluctuation that even with a regulator at the page source line, it can not keep up. From the above disclosures, it is clear that if noise is introduced to the signal CLSRC at the page source line 34, it will cause errors during sensing of every memory cell coupled to the page source line.

Improved Low Noise Sense Module Array

In a preferred implementation of a sense module which is capable of operating with reduced supply voltage, a voltage boosting circuit is employed to increase a dynamic range of a discharging voltage being sensed. When the sense module has identified a cell with a conduction current higher than a reference current, the cell is locked out from further sensing and the associated bit line is shorted to the source line of the page in order to turn off the lockout cell. In this lockout mode, a step up voltage generated by the voltage boosting circuit becomes a source of noise and is liable to propagate to the bit line of the cell and also to the source line of the page, thereby interfering with other operating sense modules. This source of noise is isolated from reaching the bit line and the source line whenever the sense module has entered the lockout mode. An isolation circuit is disposed between the source of the noise and an intermediate circuit coupling the bit line and the source line to the voltage boosting circuit.

In a general embodiment, a transfer gate is employed as the isolation circuit. The transfer gate is turned off by a latched signal indicating the lockout mode resulting from the memory cell having been identified to have a conduction current higher than a reference current and has been locked out from further sensing operation of the page. The turning off of the transfer gate cuts the noise path to the bit line of the memory cell and the source line of the page.

In a preferred embodiment, the transfer gate is disposed between the intermediate circuit and a node at which the discharging voltage is being sensed and where the boosted voltage is applied.

Figure 16:
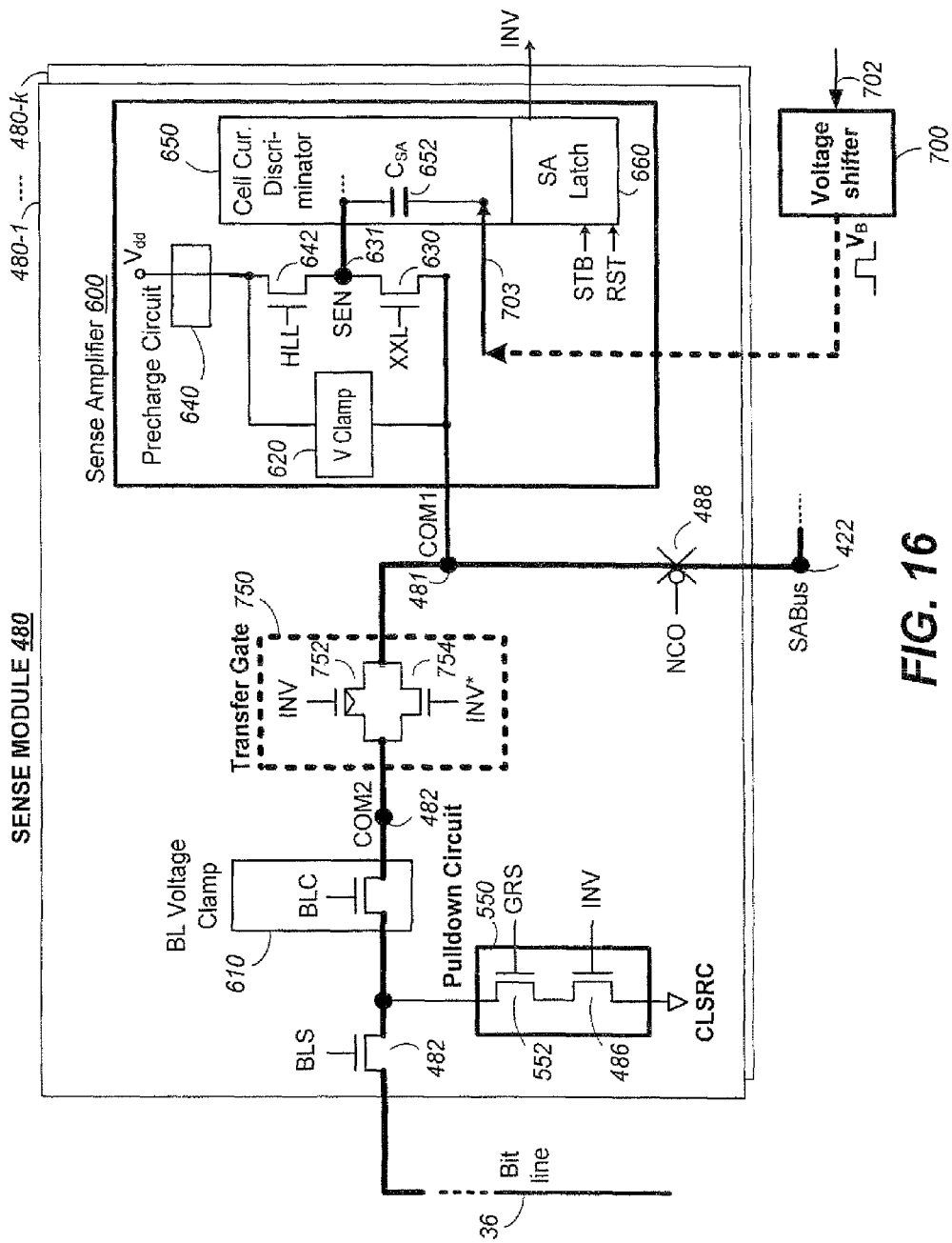
FIG. 16 illustrates a sense module stack with improved noise isolation from lockout sense modules, according to a preferred embodiment.

FIG. 16 illustrates a sense module stack with improved noise isolation from lockout sense modules, according to a preferred embodiment. The sense module stack consists of sense modules 480-1 to 480-k sharing a common SABus 422. In operation, a page of memory cells is sensed in parallel. As shown in FIG. 11, there are p sense modules connecting via p bit lines to the page of p memory cells. Thus, the sense module stack shown in FIG. 16 is representative of one of p/k stacks forming the entire set of sense modules for the page. The page of memory cells has the source of each memory cell coupled to the page source line 34 (see FIG. 14 and FIG. 15) having a voltage CLSRC.

Each sense module 480 is similar to the existing sense module 480' shown in FIG. 12A and FIG. 12B. One difference is the incorporation of a transfer gate 750 controlled by the signal INV which is set according to the sensed result of the memory cell. In the preferred implementation, the transfer gate 750 comprises a p-transistor 752 and an n-transistor 754. A first node of the transfer gate has the source of the p-transistor 752 coupled to the drain of the n-transistor 754. A second node of the transfer gate has the drain of the p-transistor coupled to the source of the n-transistor 754. The two nodes are connected across the COM1 node 481 and a node 482. The node 482 carries a signal COM2 and is located between the transfer gate 750 and the bit line voltage clamp 610. The p-transistor 752 is gated by the signal INV and the n-transistor 754 is gated by INV*, which is the inversion of INV.

When the cell current is determined by the sense amplifier 600 to be higher than a reference current, INV is set HIGH and latched. The bit line is pulled to CLSRC at the page source line 34 (see FIG. 14 and FIG. 15.) With the source and drain at essentially the same potential, the cell current is turned off and the sense module enters into the lockout mode and becomes inactive while other sense modules continue to perform sensing of their respective memory cells. In the lockout mode, INV being HIGH will turn off the transfer gate 750. Thus, the noise due to the shifting of the voltage in $V_B$ can propagate as far as the SEN node 631 and the COM1 node 481 only to be cut off by the transfer gate whenever the sense module is in the lockout mode. In this way, the noise from any lockout sense module is prevented from interfering with those sense modules still engaged in sensing.

Another feature of the preferred embodiment for the transfer gate shown in FIG. 16 is that with the constitution of the p-transistor 752 in the transfer gate 750 in the path between the bit line and ultimately Vdd, the p-transistor serves the pull-up function of the previous p-transistor 644 in the previous precharge circuit 640' shown in FIG. 12A. Thus, in FIG. 16, the precharge circuit 640 in the improved sense module 480 no longer requires a p-transistor for pull-up. The precharge circuit 640 is simply a connection to Vdd. The transfer gate is turned on during the precharge operation to perform the pull up to Vdd.

Figure 17:
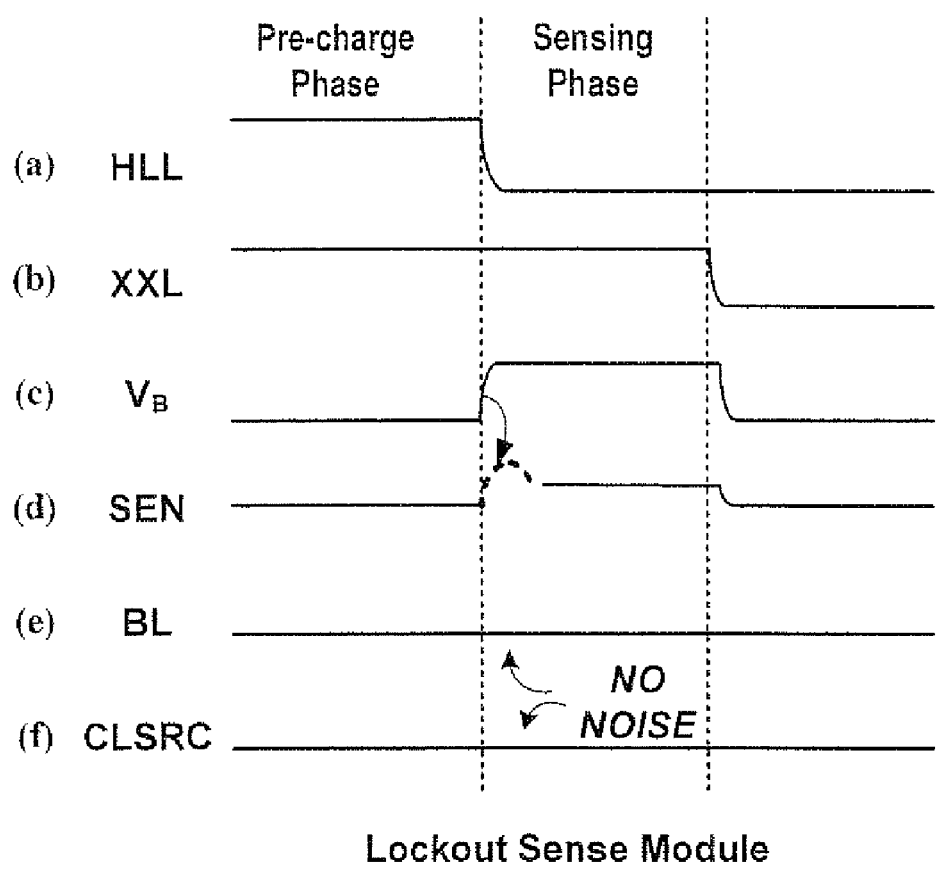
FIG. 17 illustrates the timing of the control signals for the improved sense module shown in FIG. 16 that has entered the lockout mode.

FIG. 17 illustrates the timing of the control signals for the improved sense module shown in FIG. 16 that has entered the lockout mode. In the lockout mode the transfer gate 750 of the sense module 480 blocks the noise from the voltage boosting circuit from reaching the page source line as well as the bit line. Referring to both FIG. 17 and FIG. 16 the sensing period for all sense modules starts with HLL (FIG. 17(*a*)) cutting off the precharge circuit 640' from the SEN node 631 and ends with XXL (FIG. 17(*b*)) cutting off the cell current from further discharging the SEN node. During the sensing period, the sense node is boosted with $V_B$ supplied from the voltage boosting circuit. For the sense module in the lockout mode, the SEN node 631 is, except for the intervening transfer gate 750, coupled to the bit line 36 which is also coupled to the CLSRC page source line 34 via the pulldown circuit 550. With the cell current turned off, the abrupt shift in voltage level of $V_B$ at the beginning of the sensing period (FIG. 17(*c*)) causes a ripple at the SEN node (FIG. 17(*d*)). The propagation of this ripple as noise is stopped by the turned-off transfer gate 750 from reaching the coupled bit line (FIG. 17(*e*)) and the CLSRC page source line (FIG. 17(*f*)). Compared to corresponding ones shown in FIG. 13(*e*) and FIG. 13(*f*), there is no noise in the bit line of the lockout improved sense module or in the page source line of the entire page.

In another preferred embodiment, the transfer gate is disposed between the voltage boosting circuit and the node at which the discharging voltage is being sensed.

Figure 18:
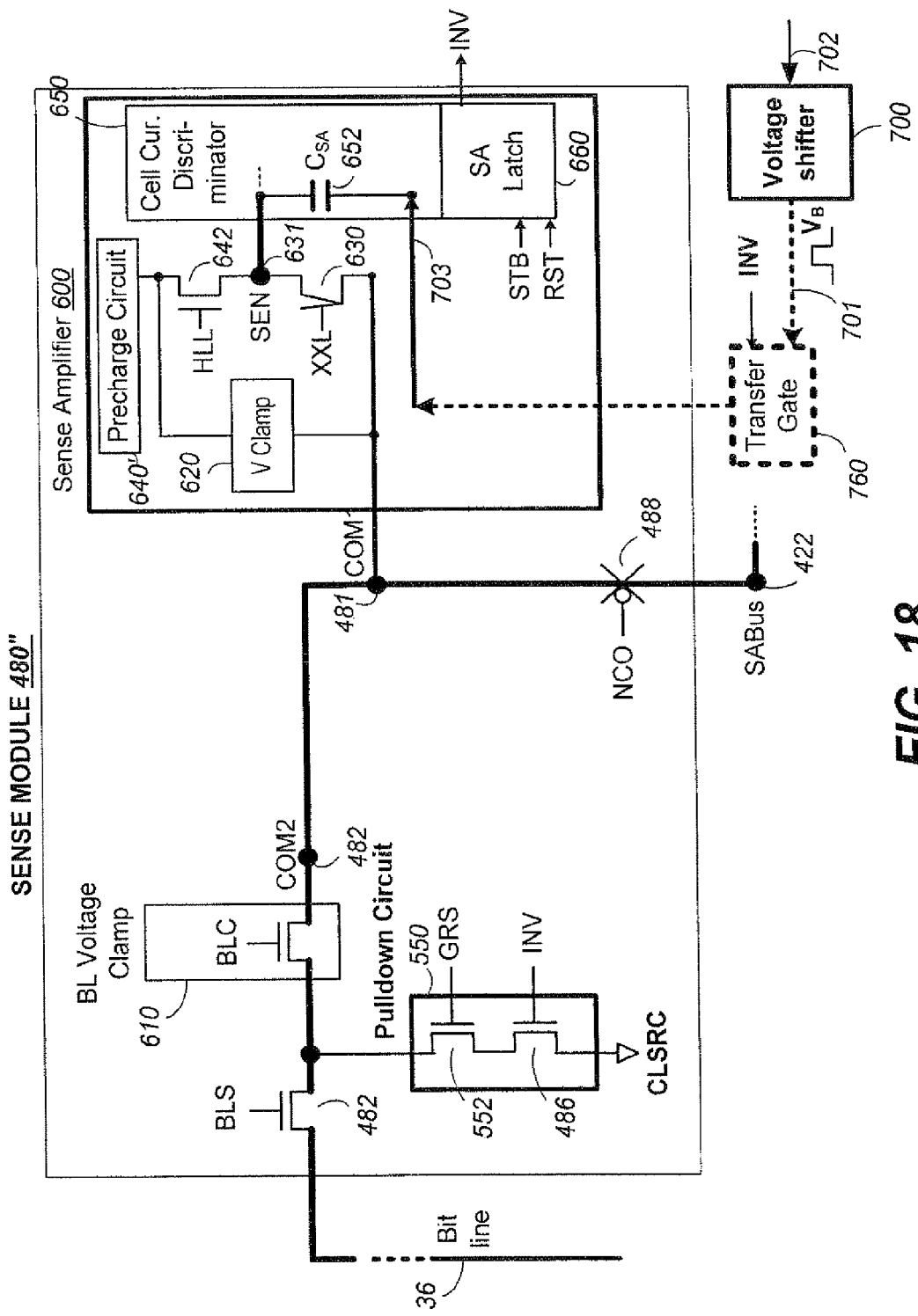
FIG. 18 illustrates a sense module stack with improved noise isolation from lockout sense modules, according to an alternative preferred embodiment.

FIG. 18 illustrates a sense module stack with improved noise isolation from lockout sense modules, according to an alternative preferred embodiment. The sense module 480" in the alternative embodiment is similar to the sense module 480 of the preferred embodiment shown in FIG. 16, except the transfer gate 750 is replace by a similar transfer gate 760 and is relocated between the voltage boosting circuit 700 and the SEN node 631. It is situated to gate $V_B$ before it reaches the capacitor 652 via the path 703.

Figure 19:
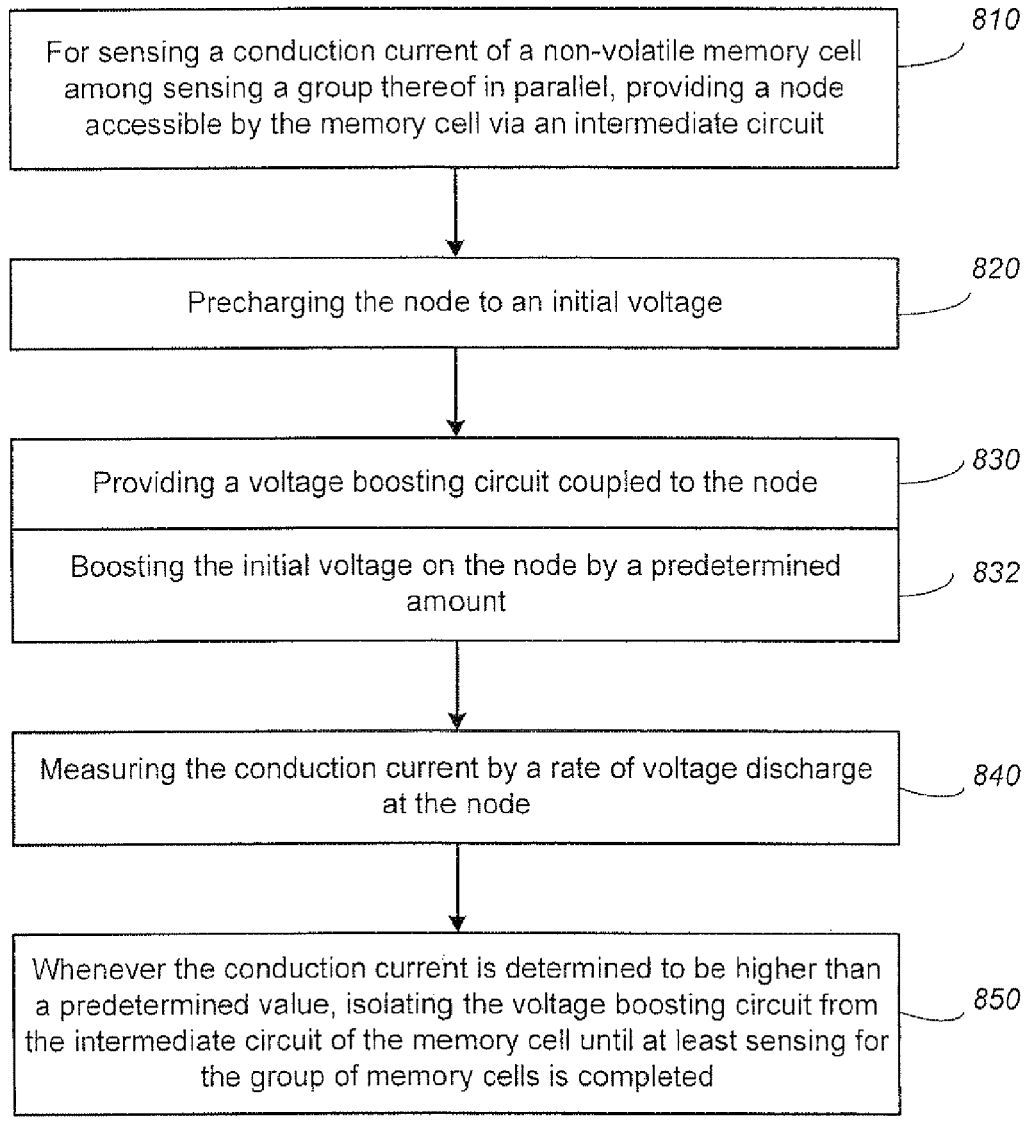
FIG. 19 is a flow diagram illustrating a method of isolating noise from a lockout sense module from interfering with others still active in sensing the page.

FIG. 19 is a flow diagram illustrating a method of isolating noise from a lockout sense module from interfering with others still active in sensing the page.

STEP 810: For sensing a conduction current of a nonvolatile memory cell among sensing a group thereof in parallel, providing a node accessible by the memory cell via an intermediate circuit.

STEP 820: Precharging the node to an initial voltage.

STEP 830: Providing a voltage boosting circuit coupled to the node.

STEP 832: Boosting the initial voltage on the node by a predetermined amount.

STEP 840: Measuring the conduction current by a rate of voltage discharge at the node.

STEP 850: Whenever the conduction current is determined to be higher than a predetermined value, isolating the voltage boosting circuit from the intermediate circuit of the memory cell until at least sensing for the group of memory cells is completed.

High Speed Sense Module Array

The various embodiments for sense modules given above, which are developed further in U.S. patent application Ser. No. 11/966,325 filed on Dec. 28, 2007, use an arrangement where the process of reading the data out of the sense amp's data latch onto the data uses part of the same pathway by which the precharge element supplies a connected bit line. This is also true of those found in U.S. Pat. Nos. 7,173,854 and 7,170,784. For instance, as shown in FIG. 12A, the data value latched into sense module 480' is fed out to the bus node 422 though switch 488. This involves the line COM1 connecting up at 481. This is the same path by which the precharge is supplied to the bit line, as shown in FIG. 12B.

This situation is considered in more detail in FIGS. 20A-C, which represents some of these sense module details rearranged somewhat for the purposes of this discussion. FIG. 20A shows what can be taken as a more or less generic version of the these other sense amps, but arranged with the precharge holding capacitor CSA 653 in the middle, what can be called the digital portion to the left, and what can be called the analog portion to the right. The analog portion, which is just a rearrangement of the corresponding parts of FIG. 12A, provides the current from the precharge capacitor 653 to the selected bit line. On the digital side, the discrimination elements then determine the state to latch in 660. The SA latch 660 can be formed from cross-coupled transistors, for example, to hold the latched value and is here responsive to the RST and STB signal.

FIG. 20B shows the analog path for sensing which the current takes from the precharge capacitor CSA 652 to the selected bit line. More specifically, it passes through nodes 631 and 481 and on through to the bitline select transistor 482. FIG. 20C shows the path for transferring data to the SA BUSS 422: the current again passes through nodes 631 and 481, where it turns to pass through transistor 488 and on to the sense amp buss at 422. Both of these paths share a common portion, from the line at SEN, on to node 631, through transistor 630, and though node 481. Consequently, until the data transfer to 422 for one sensing operation is complete, the precharge capacitor 652 can not be charged up for a next sensing operation. Consequently, one of the factors that slow down sensing performance in arrangements such as that of FIG. 20A is a result of the digital data transfer time (FIG. 20B) in series with analog sensing time ( FIG. 20C).

In addition to speed considerations, this arrangement creates noise in the analog sensing path as, in order to pass a high data value of Vdd through the transistor 630, it will commonly require that XXL be taken to a value above Vdd in order to compensate for the threshold value of 630. After letting the data value out, XXL will typically be taken back down to Vdd, but as this can take some time, this introduces noise which then passes though BL clamp 610 and then following along the path described above with respect to FIG. 12B with effects similar to those discussed there.

The arrangements presented here introduce a new methodology to separate analog and digital parts in the sense module circuitry such that these both can be done in parallel. In this way, the sensing performance can improve in a typical design by approximately 10%. Moreover, this helps to eliminate noise on the analog sensing path during sensing and reduce switching current. As will be seen with respect to FIG. 21A, this sort of design allows the next sensing environment to be prepared while the memory transfers out the previous sensing data.

FIG. 21A illustrates some aspects of the methodology in the context of sense module of FIG. 20A. Other embodiments can be based on, or combined with, the various other embodiments given in the preceding section as well as in other sense modules, such as those of U.S. Pat. Nos. 7,173,854 and 7,170,784.

The exemplary embodiment of FIG. 21A again shows a precharge element CSA 652 at center, with analog section to the left and the digital section to the right. The digital section includes the SA Latch 660, which can be constructed as before, and a discrimination element 650. Within the Dcrm 650, the transistors 654 and 656 are as before, but rather than having a transistor 658 controller by RST connecting the node 657 to ground, node 657 is now connected through transistor 2101 to the node 422 and from there on to the SABus. Consequently, the latched data is now transferred out along this path though the transistor 2101 controlled by the signal RST_NCO, which incorporates the function of the former NCO signal with the RST signal. As the path for transferring out data is now entirely within the digital side, the former switch 488 of FIG. 20A controlled by NCO is no longer need serve this function.

FIG. 21B shows the analog path for sensing which the path current takes from the precharge capacitor CSA 652 to the selected bit line and is much the same as for FIG. 20B. The digital path for transferring data to the SA BUSS 422 is shown in FIG. 21C and, unlike FIG. 20C, this does not overlap with the analog path as the level INV is now transferred from node 657 to node 422 by switch 2101. Consequently, once the discrimination element 650 has established the result of the sensing operation, the sense module need not wait for the digital result to be transferred out be moving on to digital portion of the next sensing operation, but can begin to charge up the capacitor and other steps, with the latched data value transferred out to the bus when convenient.

In a read process, taking the example of a 4-state memory as shown in FIG. 7, the typical process is first to read for the A states, then the B states, and finally the C states. Under the arrangements of FIG. 20A, the selected wordline is ramped up to the valued used to read for the A state and the analog portion of the read is executed: the precharge is performed and then used to supply the selected bitline along the path of FIG. 20B. The sense amp is then strobed for the discrimination section 650 to compare the state of the cell with the reference level, with the result then being latched. To read out this result, the path of FIG. 20C is then used; however, this requires the precharge capacitor to be discharged if this did not already occur in the analog portion (i.e., if the selected cell was not conducting). Once this is done, the transfer of data can then be done. Additionally, although the wordline can be ramped up to prepare for the next sensing operation (here, the B state on the selected cell), the sense amp cannot be prepared for the next sensing operation until the transfer is complete.

Once the data transfer of the result for the A read is complete using the path of FIG. 20C, the bit line can be ramped up for the B read, which then proceeds in the same way, before going on to the C read. Consequently, under the structure of an arrangement like FIGS. 20A-C, the analog portion of the read operation up to the latching of the data result is performed in series with the data transfer portion of the digital value and the wordlines and bitline values are ramped up sequentially.

In contrast, under an arrangement like FIGS. 21A-C, once the result of the comparison is performed by the discrimination element and latched, the transfer can be performed in parallel with the preparation for the next read, allowing the transfer time to be hidden and the wordlines and bitline values to be ramped up in parallel.

Referring again to FIGS. 21A-C and taking the example of a 4-state memory as shown in FIG. 7, beginning with the read for the A states the selected wordline is ramped up to the valued used to read for the A state and the analog portion of the read is executed: the precharge is performed and then used to supply the selected bitline along the path of FIG. 21B. The sense amp is then strobed for the discrimination section 650 to compare the state of the cell with the reference level, with the result then being latched. At this point the process diverges from the previous case: as the path for the data transfer of FIG. 21C is used, the analog and precharge sections can then go on to the next state, while the data transfer can then done any time before the latch is need for the result of this subsequent read. Also, as there is less need to discharge and recharge the levels in the analog/precharge elements, the noise in the analog sensing path and the needed switching currents are reduced.

As the much of the same path is used to supply the bit line current and to transfer out the data, whether for a verify operation or a regular read, the transistor 630 must be turned on by XXL for both the path of FIG. 20B and FIG. 20C. As noted above, this will result in noise rippling though transistor 630 to the BL Voltage Clamp 610, then on to the bit line itself and affect the displacement current. Using the path of FIG. 21C to transfer out the data can help to minimize this noise from the XXL as element 630 no longer needs to be turned on sufficiently to pass a "high" sensed value of Vdd on to the SA bus.

The design of FIG. 21A will also use less switching power than that of FIG. 20A for a sensing operation. Referring to FIG. 20C, in addition to needing to take NCO high to turn on the switch 488, as discussed above XXL must be taken to an elevated level to turn 630 sufficiently on. Additionally, in FIG. 20C the BL voltage clamp 610 and the bit line select switch 482 are turned off, so that BLC and BLS will both be taken low. In contrast, in FIG. 21C, there is no longer the need to toggle the BLC and BLS values during the data transfer and XXL does not need to be taken to an elevated value. Instead, only the switch needed to transfer out the latched value (2101) needs to be turned on. Further, FIGS. 20A-C are simplified diagrams and the analog section of these may include a number of other elements that would require switching in the transition from the mode of FIG. 20B to that of FIG. 20C.

Although the various aspects of the present invention have been described with respect to certain embodiments, it is understood that the invention is entitled to protection within the full scope of the appended claims.

It is claimed:

1. A method of sensing a conduction current of a first memory cell among a group of non-volatile memory cells being sensed in parallel and providing the result thereof to a data bus, comprising:
   providing a node accessible by one or more memory cells via an intermediate circuit;
   precharging the node to an initial voltage for a first sensing operation;
   discharging the node through a first of the memory cells via the intermediate circuit;
   measuring the conduction current though the first memory cell by the rate of said discharging of the node;
   latching the result of said measuring;
   outputting the latched result to the data bus; and
   subsequent to said latching but prior to completing said outputting, precharging the node for a second sensing operation.

2. A method as in claim 1, wherein each memory cell of the group is accessible by an associated bit line, the method further comprising:
   coupling said intermediate circuit to the associated bit line for the first of the memory cells prior to said discharging.

3. A method as in claim 1, wherein the group of nonvolatile memory cells are a portion of a flash EEPROM.

4. A method as in claim 3, wherein the flash EEPROM is of NAND type.

5. A method as in claim 1, wherein individual non-volatile memory cells each contain a charge storage element.

6. A method as in claim 5, wherein the charge storage element is a floating gate.

7. A method as in claim 5, wherein the charge storage element is a dielectric layer.

8. A method as in claim 1, wherein said measuring includes comparing the conduction current to a reference value.

9. A method as in claim 1, wherein the outputting the latched result is supplied to the data bus independently of switching levels in the intermediate circuit.

10. A method of sensing a conduction current of a first memory cell among a group of non-volatile memory cells being sensed in parallel and providing the result thereof to a data bus, comprising:
    providing a node accessible by one or more memory cells via an intermediate circuit;
    precharging the node to an initial voltage for a first sensing operation;
    discharging the node through a first of the memory cells via the intermediate circuit;
    measuring the conduction current though the first memory cell by the rate of said discharging of the node;
    latching the result of said measuring; and
    outputting the latched result to the data bus by a path independent of the node and the intermediate circuit.

11. A method as in claim 10, wherein each memory cell of the group is accessible by an associated bit line, the method further comprising:
    coupling said intermediate circuit to the associated bit line for the first of the memory cells prior to said discharging.

12. A method as in claim 10, wherein the group of non-volatile memory cells are a portion of a flash EEPROM.

13. A method as in claim 12, wherein the flash EEPROM is of NAND type.

14. A method as in claim 10, wherein individual non-volatile memory cells each contain a charge storage element.

15. A method as in claim 14, wherein the charge storage element is a floating gate.

16. A method as in claim 14, wherein the charge storage element is a dielectric layer.

17. A method as in claim 10, wherein said measuring includes comparing the conduction current to a reference value.

* * * * *